United States Patent
Kondoh

(10) Patent No.: US 9,448,063 B2
(45) Date of Patent: Sep. 20, 2016

(54) METHOD AND APPARATUS FOR DETECTING POSITION OF SUBSTRATE TRANSFER DEVICE, AND STORAGE MEDIUM

(71) Applicant: Tokyo Electron Limited, Tokyo (JP)

(72) Inventor: Keisuke Kondoh, Yamanashi (JP)

(73) Assignee: TOYKO ELECTRON LIMITED, Tokyo (JP)

( * ) Notice: Subject to any disclaimer, the term of this patent is extended or adjusted under 35 U.S.C. 154(b) by 112 days.

(21) Appl. No.: 14/613,265

(22) Filed: Feb. 3, 2015

(65) Prior Publication Data

US 2015/0219439 A1    Aug. 6, 2015

(30) Foreign Application Priority Data

Feb. 5, 2014   (JP) ................................. 2014-020709

(51) Int. Cl.
| | |
|---|---|
| *G01B 11/14* | (2006.01) |
| *H01L 21/68* | (2006.01) |
| *H01L 21/67* | (2006.01) |
| *H01L 21/677* | (2006.01) |

(52) U.S. Cl.
CPC ......... *G01B 11/14* (2013.01); *H01L 21/67259* (2013.01); *H01L 21/67766* (2013.01); *H01L 21/681* (2013.01)

(58) Field of Classification Search
CPC .......................... G01N 21/94; G01N 21/95607
USPC ................. 700/213, 114, 228, 121–125, 264
See application file for complete search history.

(56) References Cited

U.S. PATENT DOCUMENTS

| | | | |
|---|---|---|---|
| 6,950,721 B2 * | 9/2005 | Tashiro | H01L 21/68 700/213 |
| 2005/0201424 A1 | 9/2005 | Yoshida et al. | |
| 2006/0138367 A1 | 6/2006 | Kondoh | |
| 2009/0041563 A1 * | 2/2009 | Takahashi | B24B 37/345 414/222.01 |

FOREIGN PATENT DOCUMENTS

| | | |
|---|---|---|
| JP | 2005-260176 A | 9/2005 |
| JP | 2006-185960 A | 7/2006 |

\* cited by examiner

*Primary Examiner* — Kara E Geisel
*Assistant Examiner* — Iyabo S Alli

(57) ABSTRACT

In a method for detecting a position of a substrate transfer device including a substrate supporting unit, the light-transmitting optical sensor is moved with respect to a detection target provided at a predetermined relative position with respect to a position where a substrate is to be transferred by the substrate transfer device, and a vertical dimension of the detection target that blocks the optical axis is measured by setting the substrate supporting unit in a first orientation and relatively moving up or down the optical sensor with respect to the detection target. A vertical dimension of the detection target that blocks the optical axis is measured by setting the substrate supporting unit in a second orientation and relatively moving the optical sensor with respect to the detection target. Horizontal coordinates of a reference position of the detection target are obtained based on the measured vertical dimensions in the respective orientations.

12 Claims, 22 Drawing Sheets

STEP 2

STEP 4

*FIG. 15*
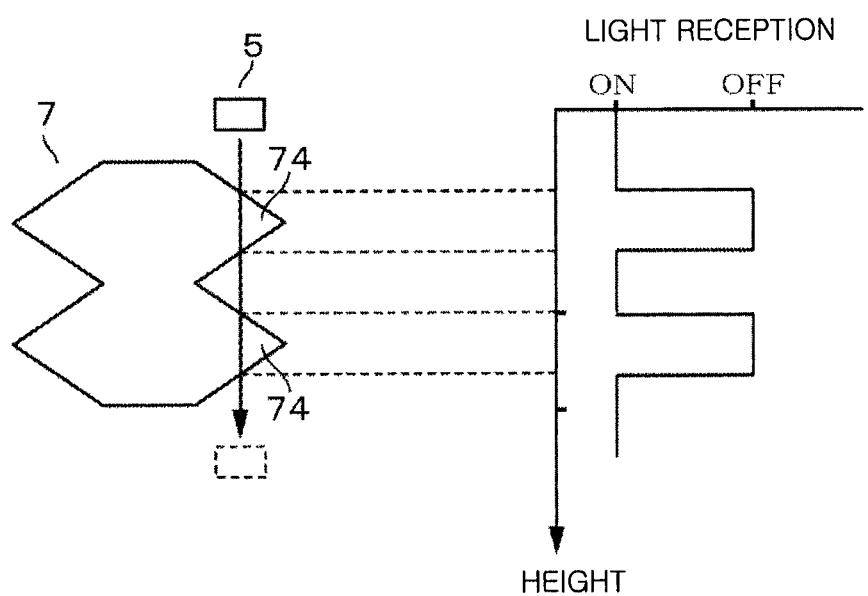
*FIG. 16A*  *FIG. 16B*
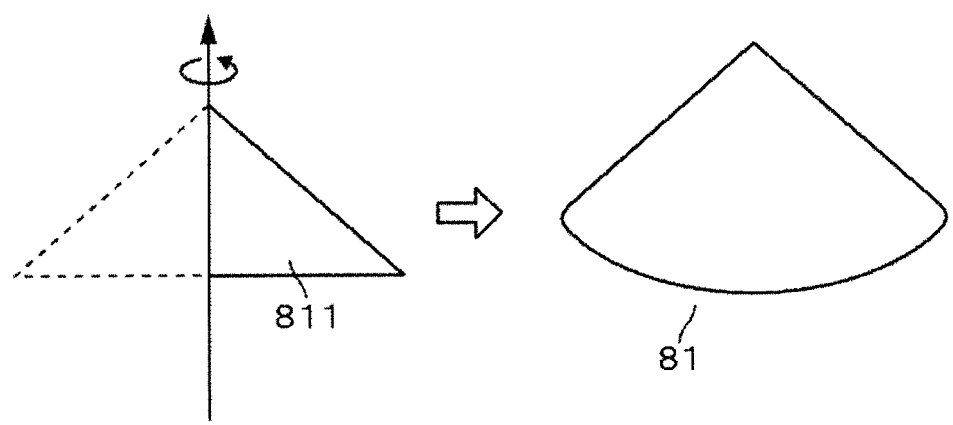

*FIG. 17A* *FIG. 17B*
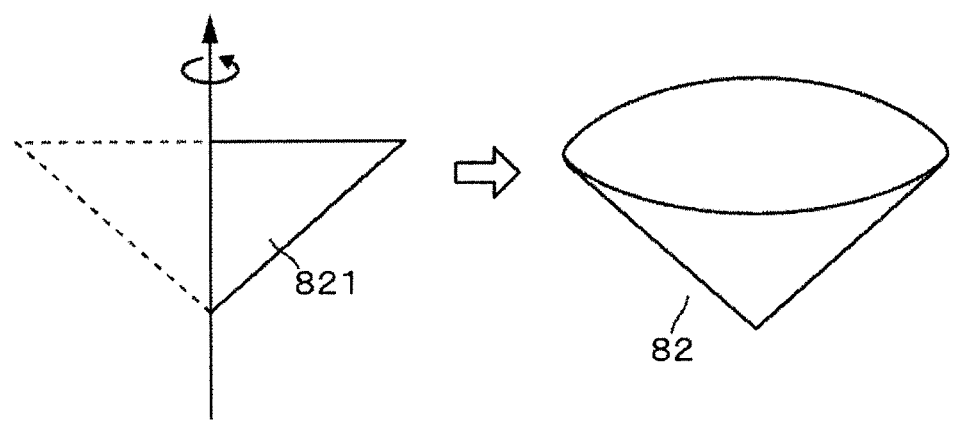
*FIG. 18A* *FIG. 18B*
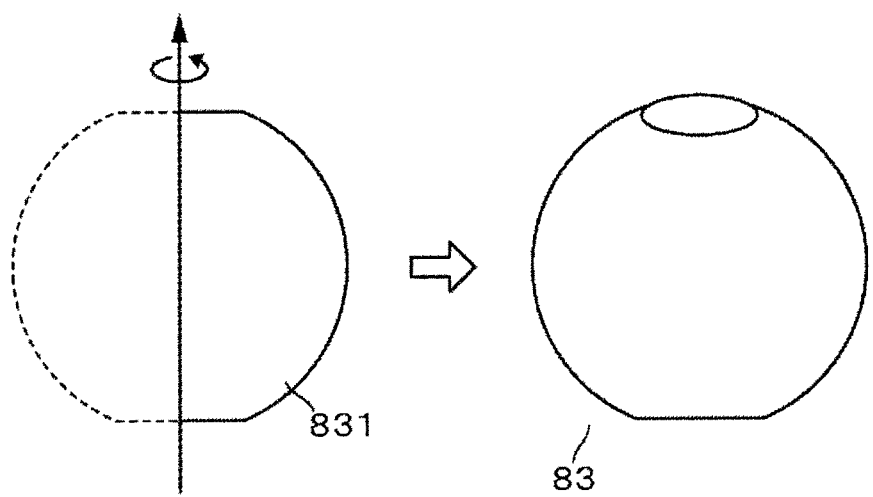

METHOD AND APPARATUS FOR DETECTING POSITION OF SUBSTRATE TRANSFER DEVICE, AND STORAGE MEDIUM

CROSS-REFERENCE TO RELATED APPLICATIONS

This application claims priority to Japanese Patent Application No. 2014-020709 filed on Feb. 5, 2014, the entire contents of which are incorporated herein by reference.

FIELD OF THE INVENTION

The present invention relates to a technique for detecting a coordinate position of a substrate transfer device for transferring a substrate.

BACKGROUND OF THE INVENTION

A substrate processing apparatus for processing a substrate such as a semiconductor wafer or the like includes, e.g., a FOUP that is a transfer container or a plurality of modules used for processing or transferring a substrate. The substrate is transferred therebetween by a transfer arm.

In such a substrate processing apparatus, coordinates (X, Y, Z) of a position where the transfer arm enters a module need to be acquired to transfer the substrate to a proper position in the module. To that end, an apparatus maker, for example, performs teaching for acquiring the coordinates of the entering position of the transfer arm based on reference coordinates which are acquired when the apparatus is manufactured.

When the apparatus is assembled by a user, an assembly error may occur and the coordinates (X, Y, Z) of the entering position of the transfer arm may be different from coordinates provided by the maker. Therefore, the user also needs to perform the teaching.

In order to automatically perform the teaching, the position of the transfer arm needs to be detected in advance. In other words, it is required to obtain corresponding relation between a position in an actual transfer space and a position in a coordinate system managed by a driving system of the transfer arm.

Japanese Patent Application Publication No. 2006-185960 (see paragraphs [0026] to [0032] and FIG. 3) discloses a technique for detecting a vertical position of a jig by using a mapping sensor provided at a transfer arm. In this technique, a horizontal position of the jig cannot be automatically obtained, so that the horizontal position of the jig is detected by manually moving the transfer arm. This requires skills and leads to increase in the number of processes.

Japanese Patent Application Publication No. 2005-260176 (see paragraphs [0067], [0083], [0087], [0090] and the like) discloses a technique for acquiring information on a vertical position of a target by emitting laser beam to a target jig and then acquiring information on a radial position of the target jig by using a non-contact sensor (mapping sensor). However, in this technique, the target jig needs to be located at a transfer position by an operator and, thus, the teaching cannot be automatically performed. Further, in this technique, although the information on the vertical position and the radial position of the target position can be acquired, XY coordinate in the horizontal plane cannot be detected.

SUMMARY OF THE INVENTION

In view of the above, the present invention provides a technique capable of automatically detecting a horizontal position of a substrate transfer device for transferring a substrate.

In accordance with an aspect of the present invention, there is provided a method for detecting a position of a substrate transfer device including a substrate supporting unit for supporting a substrate, the substrate supporting unit being movable in a back-and-forth direction, movable in a direction intersecting with the back-and-forth direction and rotatable about a vertical axis, the method including: providing a light-transmitting optical sensor at the substrate transfer device such that a light emitting portion and a light receiving portion of the optical sensor face each other in a direction intersecting with the back-and-forth direction and has an optical axis of which horizontal position and orientation are determined by a horizontal position and an orientation of the substrate supporting unit; providing a detection target at a predetermined relative position with respect to a position where a substrate is to be transferred by the substrate transfer device so as to block the optical axis of the optical sensor and has an inclined surface that is inclined when seen from an extension direction of the optical axis in the case where the substrate supporting unit is set in a first orientation and an inclined surface that is inclined when seen from an extension direction of the optical axis in the case where the substrate supporting unit is set in a second orientation; measuring a vertical dimension of the detection target that blocks the optical axis by setting the substrate supporting unit in the first orientation and relatively moving up or down the optical sensor with respect to the detection target; measuring a vertical dimension of the detection target that blocks the optical axis by setting the substrate supporting unit in the second orientation and relatively moving up or down the optical sensor with respect to the detection target; and obtaining horizontal coordinates of a reference position of the detection target based on the measured vertical dimensions in the respective orientations.

In accordance with another aspect of the present invention, there is provided a non-transitory storage medium that stores a computer program used in an apparatus for detecting a position of a substrate transfer device including a substrate supporting unit for supporting a substrate, the substrate supporting unit being movable in a back-and-forth direction, movable in a direction perpendicular to the back-and-forth direction and rotatable about a vertical axis, wherein the computer program includes steps of executing the method for detecting a position of a substrate transfer device.

In accordance with still another aspect of the present invention, there is provided an apparatus for detecting a position of a substrate transfer device including a substrate supporting unit for supporting a substrate, the substrate supporting unit being movable in a back-and-forth direction, movable in a direction intersecting with the back-and-forth direction, and rotatable about a vertical axis, including apparatus comprising: a light-transmitting optical sensor provided at the substrate transfer device such that a light emitting portion and a light receiving portion face each other in a direction intersecting with the back-and-forth direction, the light-transmitting optical sensor having an optical axis of which horizontal position and orientation are determined by a horizontal position and an orientation of the substrate supporting unit; a detection target provided at a predetermined relative position with respect to a position where a substrate is to be transferred by the substrate transfer device so as to block the optical axis of the optical sensor, the detection target having an inclined surface that is inclined when seen from an extension direction of the optical axis in the case where the substrate supporting unit is set in a first orientation and an inclined surface that is inclined when seen from an extension direction of the optical axis in the case where the substrate supporting unit is set in a second orientation; an elevation unit configured to relatively move up and down the optical sensor with respect to the detection target; and a control unit configured to measure a vertical dimension of the detection target that blocks the optical axis by relatively moving up or down the optical sensor with respect to the detection detector while setting the substrate supporting unit in the first orientation and in the second orientation and acquiring horizontal coordinates of a reference position of the detection target based on the measured vertical dimension in the respective orientations.

With such configurations, the vertical dimension of the detection target that blocks the optical axis of the optical sensor is measured by relatively moving up or down the light-transmitting optical sensor provided at the substrate transfer device with respect to the detection target. The detection target has the inclined surface that is inclined when seen from the extension direction of the optical axis in the case where the substrate supporting unit is set in the first orientation and another inclined surface that is inclined when seen from the extension direction of the optical axis in the case where the substrate supporting unit is set in the second orientation.

By measuring the vertical dimension of the detection target while setting the substrate supporting unit in the first orientation and in the second orientation, the horizontal distance in each orientation from the position of the inclined surface where the vertical dimension is measured to the reference position of the detection target can be obtained. Equations of two straight lines having different inclinations and passing through the reference position are obtained by using the measured horizontal distances in the respective orientations. The coordinates of the intersection point of the equations are acquired as the horizontal coordinates of the reference position. Since the coordinates of the reference position have been acquired by using a coordinate system managed by the driving system of the substrate transfer device, the horizontal position of the substrate transfer device can be automatically detected.

BRIEF DESCRIPTION OF THE DRAWINGS

The objects and features of the present invention will become apparent from the following description of embodiments, given in conjunction with the accompanying drawings, in which:

FIG. 15 shows a side view of the detection target and the optical sensor and a characteristic view of light reception/non-reception data of the optical sensor;

FIGS. 16A and 16B show a perspective view and an explanatory view of still another example of the detection target, respectively;

FIGS. 17A and 17B show a perspective view and an explanatory view of further still another example of the detection target, respectively;

FIGS. 18A and 18B show a perspective view and an explaining further still another example of the detection target, respectively;

DETAILED DESCRIPTION OF THE EMBODIMENTS

Figure 1:
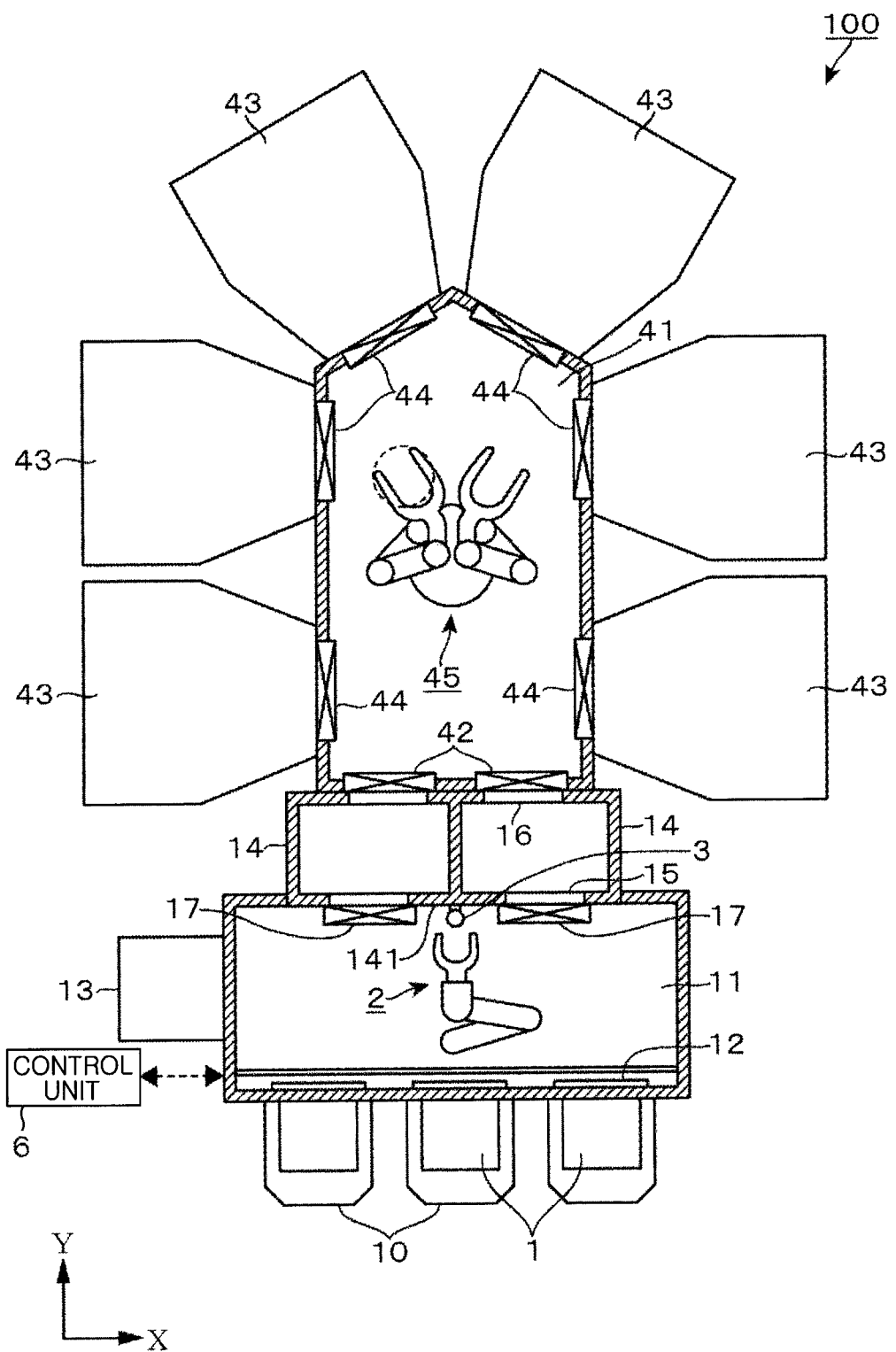
FIG. 1 shows a top view of a vacuum processing apparatus including a position alignment unit of a substrate transfer device in accordance with a first embodiment of the present invention.

Hereinafter, embodiments of the present invention will be described with reference to the accompanying drawings.

A first embodiment of a vacuum processing apparatus that is a multi-chamber system including a position detection unit for a substrate transfer device of the present invention will be described. First, the vacuum processing apparatus will be explained with reference to FIGS. 1 and 2. A vacuum processing apparatus 100 includes a horizontally elongated normal pressure transfer chamber 11. The inside of the normal pressure transfer chamber 11 is set to a normal pressure atmosphere by using, e.g., nitrogen gas. A plurality of load ports 10 for transferring a substrate with respect to a transfer container 1, e.g., a FOUP, is arranged in an orientation in front of the normal pressure transfer chamber 11. Provided on a front wall of the normal pressure transfer chamber 11 are wafer transfer openings (not shown) through which a semiconductor wafer W (hereinafter, referred to as "wafer") is loaded and unloaded. An opening/closing door 12 that is opened and closed together with a cover (not shown) is installed at each of the wafer transfer openings. Hereinafter, the arrangement direction of the load ports 10 is set to an X direction; a direction perpendicular to the arrangement direction of the load ports 10 is set to a Y direction; and a vertical direction of the apparatus is set to a Z direction.

An alignment chamber 13 for adjusting an orientation or eccentricity of the wafer W is provided at a left wall of the normal pressure transfer chamber 11 when seen from the load port 10 side. A gas exhaust opening (not shown) for exhausting the normal pressure transfer chamber 11 is provided at the bottom surface of the normal pressure transfer chamber 11, so that the normal pressure transfer chamber 11 can be exhausted through the gas exhaust opening by using a gas exhaust device such as a gas exhaust fan or the like. A first transfer arm 2 serving as a substrate transfer device for transferring the wafer W and a detection target 3 are provided in the normal pressure transfer chamber 11. The first transfer arm 2 and the detection target 3 will be described later.

Two load-lock chambers 14, for example, are provided at a side of the normal pressure transfer chamber 11 which is opposite to the side where the load ports 10 are provided. In a state where the wafer W is made to wait, an inner atmosphere of each load-lock chamber 14 is switched between a normal pressure atmosphere and a vacuum atmosphere. A vacuum transfer chamber 41 is provided at a rear side of the load-lock chambers 14 when seen from the normal pressure transfer chamber 11 side.

Figure 2:
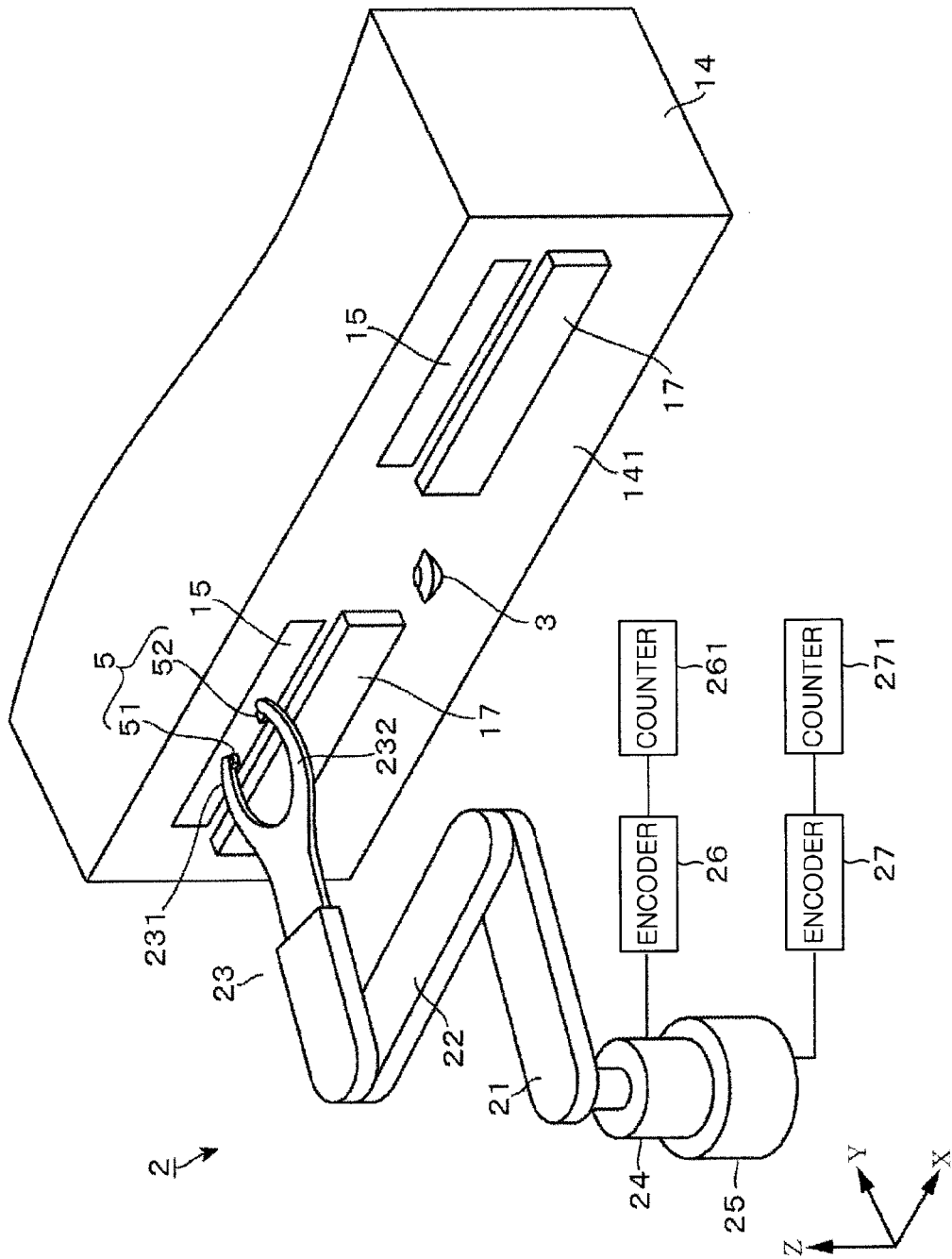
FIG. 2 shows a schematic perspective view of the substrate transfer device and a part of a load-lock chamber.

As shown in FIG. 1, each of the load-lock chambers 14 has openings 15 and 16 for loading/unloading the wafer W at the normal pressure transfer chamber 11 side and the vacuum transfer chamber 41 side, respectively. Each of the openings 15 at the normal pressure transfer chamber 11 side can be opened or closed by a door valve 17. Each of the openings 16 at the vacuum transfer chamber 41 side can be opened or closed by a gate valve 42. FIG. 2 schematically shows the first transfer arm 2 and a part of a front wall 141 of the load-lock chamber 14. In FIG. 2, the state in which the openings 15 are opened is illustrated.

A plurality of, e.g., six, vacuum processing modules is connected to the vacuum transfer chamber 41 via respective gate valves 44 respectively. A second transfer arm 45 configured as a multi-joint arm is provided in the vacuum transfer chamber 41. The wafer W is transferred between the respective load-lock chambers 14 and the respective vacuum processing modules 43 by the second transfer arm 45. A nitrogen gas supply unit is provided, e.g., at a bottom surface of the vacuum transfer chamber 41. The vacuum transfer chamber 41 is connected to a vacuum exhaust unit via a gas exhaust line. The vacuum exhaust unit vacuum-exhausts the vacuum transfer chamber 41 so that the inside of the vacuum transfer chamber 41 becomes a nitrogen gas atmosphere. Processing performed in the vacuum processing module 43 may be vacuum processing, e.g., film formation, annealing, etching, cleaning or the like.

Figure 3:
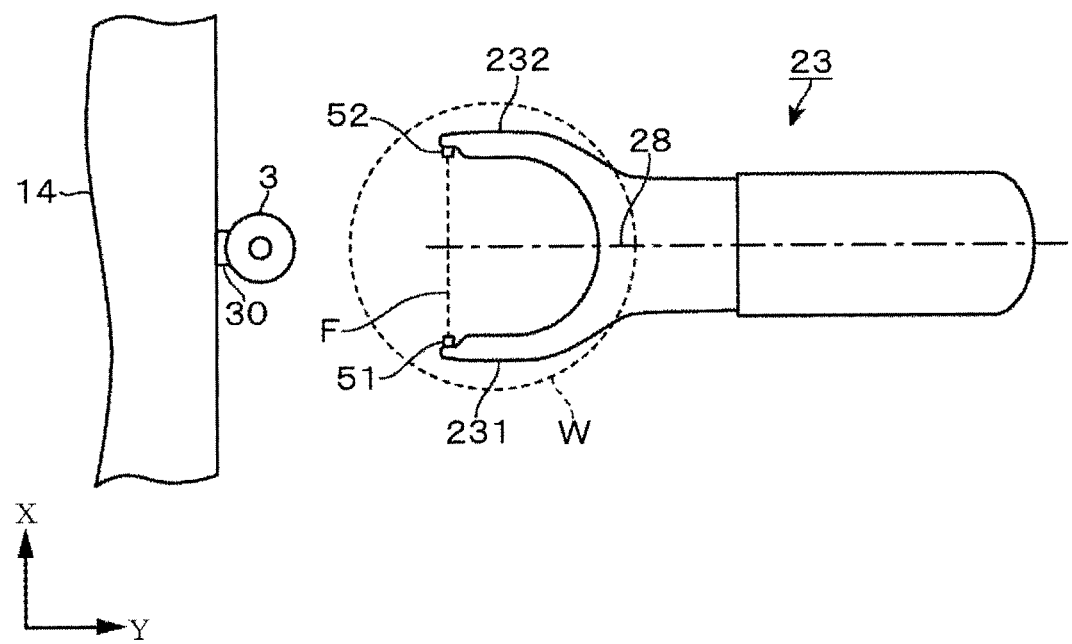
FIG. 3 shows a top view of the substrate transfer device and a detection target.
Figure 4:
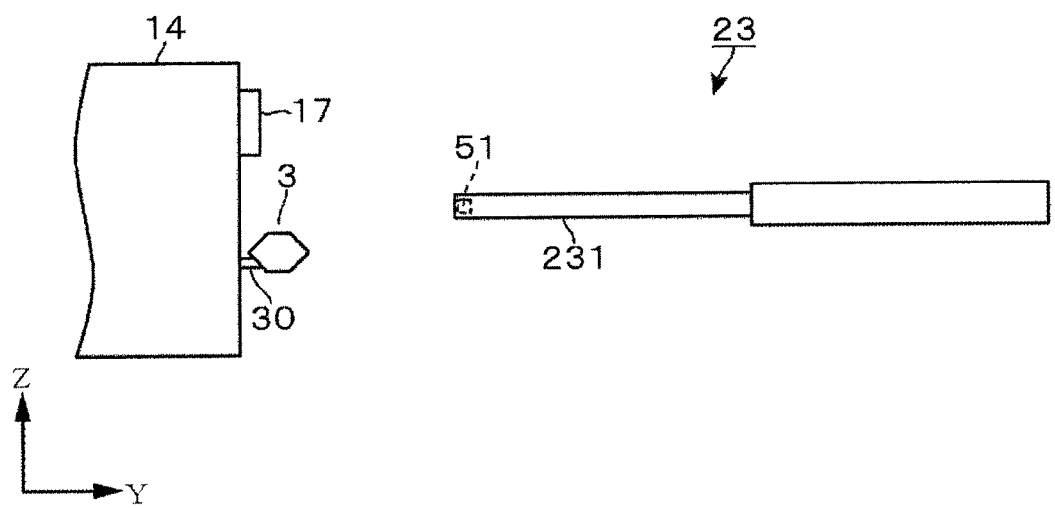
FIG. 4 shows a side view of the substrate transfer device and the detection target.

Next, the first transfer arm 2 provided in the normal pressure transfer chamber 11 will be described with reference to FIGS. 2 to 4. As shown in FIG. 2, the first transfer arm 2 is configured as a multi-joint arm including a lower arm 21, an intermediate arm 22 and a fork 23 corresponding to a substrate supporting unit for supporting the wafer W. A driving unit 24 for horizontal movement which includes four motors allows horizontal movement of the fork 23 such as reciprocation and rotation. The first transfer arm 2 can be vertically moved by an elevation unit and can transfer the wafer W between the transfer containers 1 provided at the load ports 10, the alignment chamber 13, and the load-lock chambers 14. Encoders are connected to the motors of the driving unit 24 for horizontal movement. In FIG. 2, a reference numeral 26 denotes an encoder that is representative of the encoders of the motors. The motor of the elevation unit 25 is connected to an encoder 27. The number of pulses of the encoders 26 and 27 is counted by counters 261 and 271, respectively. As shown in FIGS. 2 and 3, the fork 23 has two prongs 231 and 232 extending in a back-and-forth direction with a predetermined space therebetween when seen from the top. The wafer W is mounted on top surfaces of the prongs 231 and 232. Further, as shown in FIGS. 2 to 4, the fork 23 is provided with a light-transmitting optical sensor 5. As for the optical sensor 5, it is possible to use a mapping sensor for detecting whether or not the wafer W exists in the transfer container 1. The optical sensor 5 is provided at leading end of the fork 23 so as not to collide with the wafer W when the wafer W is mounted on the fork 23.

For example, a light emitting portion 51 is attached to an inner surface of one of the prongs 231 and 232 (prong 231 in this example). A light receiving portion 52 is attached to an inner surface of the other prong 231 or 232 (prong 232 in this example) so as to face the light emitting portion 51. An optical axis F of the optical sensor 5 is horizontally extended so as to be perpendicular to the back-and-forth direction of the fork 23, i.e., perpendicular to a central axis 28 of the fork 23 (see FIG. 3). Since the optical sensor 5 is provided at the fork 23, the horizontal position and the direction of the optical axis F of the optical sensor 5 are determined by the horizontal position and the direction of the fork 23.

Next, the detection target 3 will be described with reference to FIGS. 2 to 5B. The detection target 3 is provided so that it can block the optical axis F of the optical sensor 5. A relative position of the detection target 3 to a position where the substrate is transferred by the first transfer arm 2 is determined. In this example, as shown in FIGS. 1 to 4, the detection target 3 is disposed, at the front wall 141 of the load-lock chamber 14 where the openings 15 are formed, between the two openings 15 with a supporting member 30 therebetween so as not to disturb the transfer of the wafer W by the first transfer arm 2.

Figure 5A:
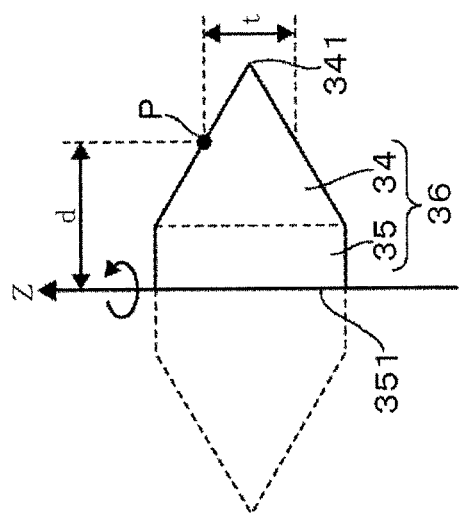
FIGS. 5A and 5B show a perspective view and an explanatory view of the detection target, respectively.
Figure 5B:
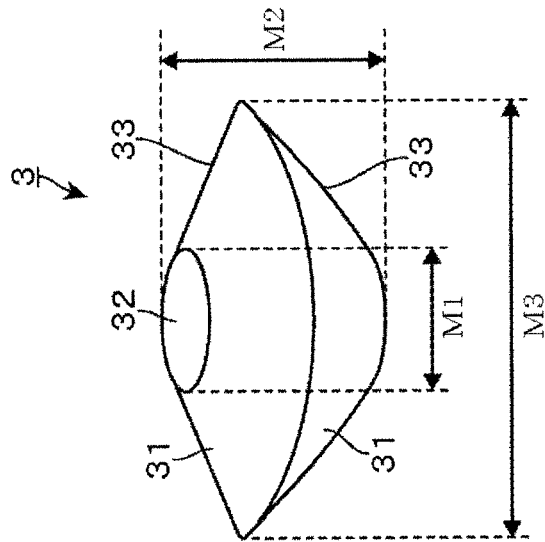

As shown in FIGS. 5A and 5B, the detection target 3 is a solid of revolution obtained by rotating a vertical plane about a vertical axis. In this example, two identical truncated cones 31 are stacked such that bottom surfaces thereof are connected to each other, thereby forming the solid of revolution. The solid of revolution is obtained by rotating about the vertical axis (Z-axis) a plane FIG. 36 formed by combining an isosceles triangular area 34 and a quadrilateral area 35 positioned at a bottom side of the isosceles triangle area 34. In a state where a vertex 341 of the isosceles triangular area 34 is directed horizontally, the plane FIG. 36 is rotated about the vertical axis corresponding to a side 251 of the quadrilateral area 35 which is opposite to the vertex 341 of the isosceles triangular area 34.

As a result, the detection target 3 has a flat circular central portion 32 and an inclined portion 33 of which vertical dimension (vertical size) is gradually decreased from the central portion 32 toward the edge portion. Since the detection target 3 is the solid of revolution, the inclined portion 33 has an inclined surface that is inclined when seen from the extension direction of the optical axis F in the case where the fork 23 is set in a first orientation and an inclined surface that is inclined when seen from the extension direction of the optical axis F in the case where the fork 23 is set in a second orientation. The height of the inclined portion 33 is continuously changed, so that a vertical dimension t at a position P on the inclined portion 33 corresponds to a horizontal distance d from the vertical axis to the position P. Therefore, the distance d can be obtained by detecting the vertical dimension t. Further, since the detection target 3 is the solid of revolution, a horizontal distance from the vertical axis which corresponds to a vertical dimension of any position in the circumferential direction of the inclined portion 33 is to the same.

The detection target 3 is made of, e.g., a metal, and has a size that allows the light emitting portion 51 and the light receiving portion 52 of the optical sensor 5 to be positioned at the opposite sides of the detection target 3 when the fork 23 moves toward the detection target 3. For example, a diameter M1 of the central portion 32 is 10 mm; a vertical dimension M2 of the central portion is 10 mm; and a vertical dimension M3 of the outer periphery of the inclined portion 33 is 30 mm. The vertical dimension of the detection target 3 is exaggerated for convenience of illustration.

Figure 6:
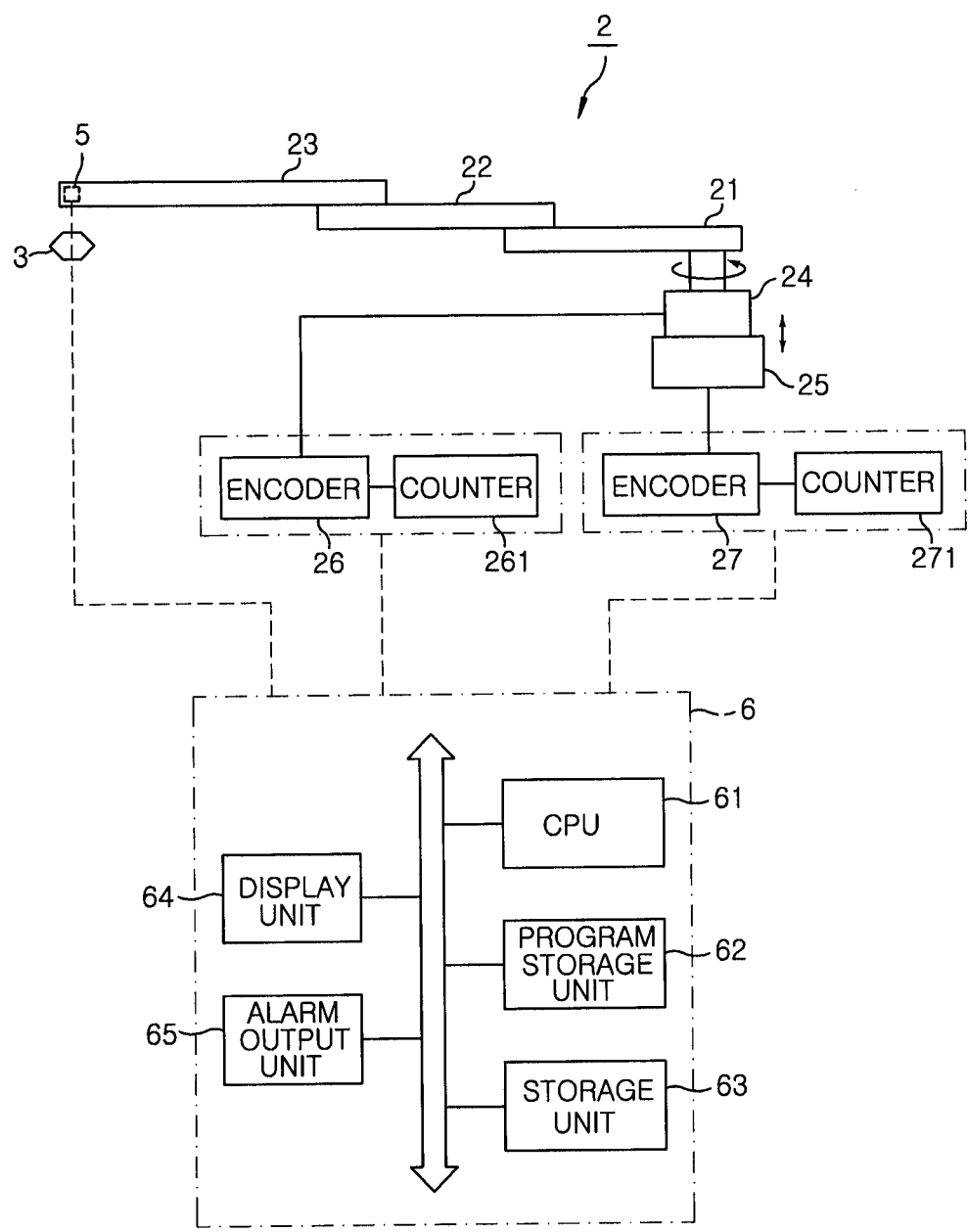
FIG. 6 shows a block diagram of the substrate transfer device, the detection target and a control unit.

Next, a control unit 6 will be described with reference to FIG. 6. The control unit 6 is, e.g., a computer, and includes a CPU 61, a program storage unit 62 and a storage unit 63. The program storage unit 62 stores a program required to execute a series of processes to be described later.

Here, coordinates managed by the driving system of the first transfer arm 2 will be described. The coordinates are managed by the counted number of pulses of the encoders 26 and 27 (as described above, a plurality of encoders for horizontal driving is represented by the encoder 26) connected to the motors of the first transfer arm 2. The coordinates have as origin a home position of the first transfer arm 2. A horizontal position in the coordinates is managed by, e.g., polar coordinates, and converted to XY coordinates based on the polar coordinates. However, for convenience, it is considered to be managed by the XY coordinates.

The program includes steps of obtaining the orientation of the fork 23 and the coordinates of the first transfer arm 2 on XYZ coordinates managed by the driving system based on the counted number of pulses of the encoders 26 and 27. The program further includes steps of acquiring light reception/non-reception data when vertically moving the optical sensor 5 with respect to the detection target 3 and calculating a position of the detection target 3 on the XYZ coordinates which will be described later. The program further includes steps of performing teaching of the first transfer arm 2 which obtains coordinates of the entering position (corresponding to the transfer position of the wafer W) of the first transfer arm 2 with respect to the load-lock chamber 14, for example, based on the calculated reference position of the detection target 3.

The program is stored in a computer storage medium, e.g., a flexible disk, a compact disk, a hard disk, a MO (magneto-optical disk) or the like and installed in the control unit 6. A screen of the computer serves as a display unit 64. The display unit 64 allows an operation of selecting predetermined substrate processing or teaching, or an operation of inputting parameters or the like in each processing. The display unit 64 is configured to display thereon the coordinates of the detection target 3, the light reception/non-reception data of the optical sensor 5 and the like. An alarm output unit 65 generates an alarm sound, or turns on a lamp, or displays an alarm on the display unit 64.

The transfer flow of the wafer W in the substrate processing apparatus 100 will be described before the explanation of the teaching. For example, an unprocessed wafer W in the transfer container 1 that is loaded on the load port 10 by, e.g., OHT (overhead hoist transport) or the like, is transferred in the following sequence: the normal pressure transfer chamber 11→the alignment chamber 13→the load-lock chamber 14→the vacuum transfer chamber 41→the vacuum processing module 43. Then, the wafer W is subjected to film formation or annealing. The processed wafer W is returned to a predetermined transfer container 1 in the reverse sequence (without passing through the alignment chamber 13).

Next, the teaching of the first transfer arm 2 will be described. The teaching is carried out after an apparatus maker performs assembly or maintenance of the apparatus or when the apparatus is delivered to a user. The teaching includes a step of obtaining coordinates of the reference position of the detection target 3. In the following description, the center of rotation of the detection target 3 is denoted by a reference position N.

First, the acquisition of the horizontal coordinates of the reference position N will be described with reference to FIGS. 7 to 13. Here, the home position of the first transfer arm 2 on the coordinates of the driving system is set to the origin O. The X-axis is set to the arrangement direction of the load ports 10. The Y-axis is set to a direction perpendicular to the arrangement direction of the load ports 10.

Figure 7:
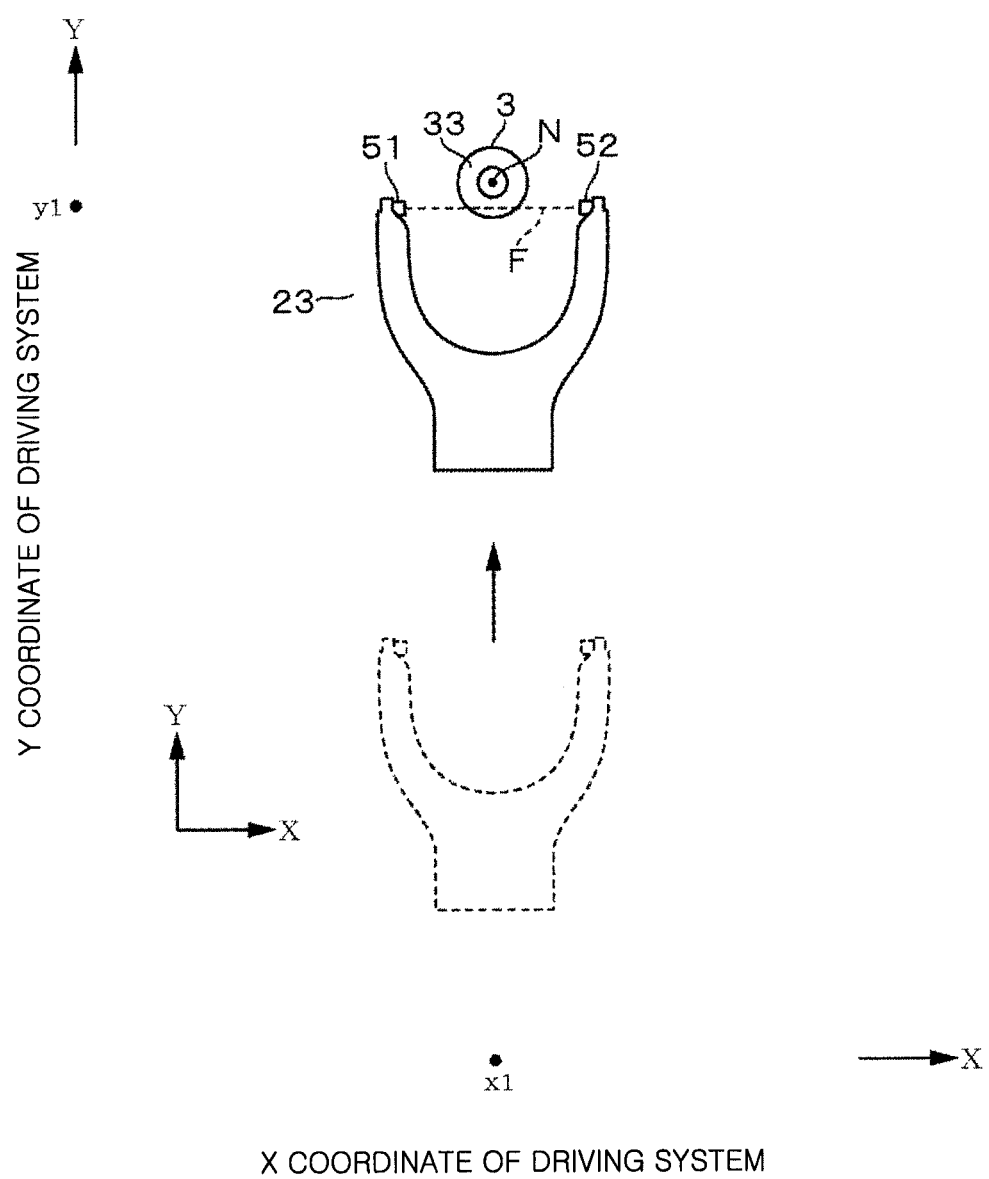
FIG. 7 shows a top view for explaining acquisition of coordinates of the detection target.
Figure 8:
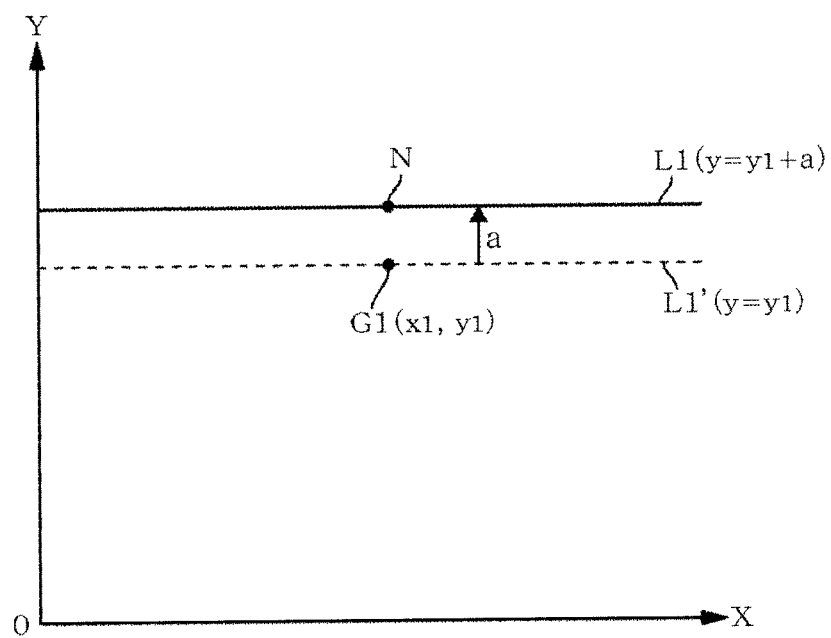
FIG. 8 is a graph showing a first straight line.

As shown in FIG. 7, the optical axis F of the optical sensor 5 is located at a first position above the inclined portion 33 of the detection target 3 by setting and moving the fork 23 in the first orientation (step 1). The first orientation is a orientation that the central axis 28 of the fork is directed along the Y axis. FIG. 8 illustrates a position G1 (x1, y1) of the first transfer arm 2 on the XY coordinates in the driving system.

Figure 9:
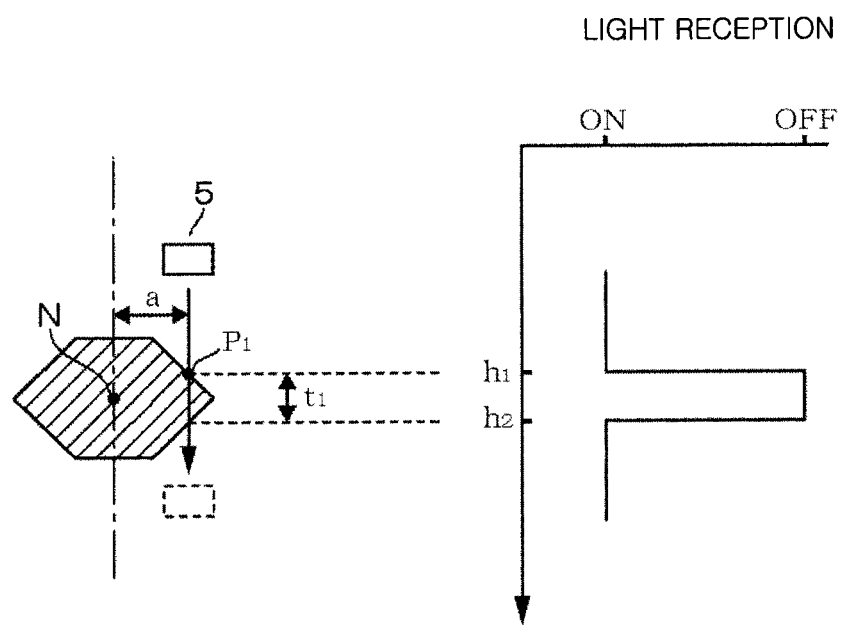
FIG. 9 shows a side view of the detection target and an optical sensor and a characteristic view of light reception/non-reception data of the optical sensor.

The data of the optical sensor 5 is acquired while lowering the fork 23 from a position above the detection target 3 to a position below the detection target 3. FIG. 9 is a graph showing corresponding relation between a vertical position and light reception/non-reception data of the optical sensor 5. A light reception state is denoted by ON and a light non-reception state is denoted by OFF.

When the fork 23 is gradually lowered, the light reception data (the state in which current flows in a photodiode) is obtained at a height where the detection target 3 does not exist. The light non-reception data is obtained at a height where the detection target 3 exists, because the optical axis F is blocked by the inclined portion 33 of the detection target 3. Accordingly, the vertical dimension t1 (h1–h2) of the inclined portion 33 is obtained by reading out the number of pulses of the encoder 27 by the counter 271.

The detection target 3 has a shape in which two truncated cones 31 are stacked as described above. Therefore, the height is not uniform at a cross section of the inclined portion 33 where the optical axis F crosses. "t1" denotes a vertical dimension at a position P1. FIG. 9 is a cross sectional view of the detection target 3 which is taken along the vertical axis so as to pass through the position P1. As described above, there is a corresponding relationship between a vertical dimension of the inclined portion 33 and a horizontal distance from the vertical axis and, thus, a horizontal distance "a" from the position P1 to the reference position N can be obtained based on the vertical dimension "t1" of the inclined portion 33. In this example, the inclined portion 33 is a solid of revolution obtained by rotating an isosceles triangle, so that the distance "a" may be calculated based on the vertical dimension of the inclined portion 33. Or, a distance corresponding to a vertical dimension may be read out from data on the corresponding relationship between a vertical dimension of the inclined portion 33 and a distance from the reference position N which has been previously obtained and stored in the storage unit 63.

Based on the data, the equation of a first straight line L1 passing through the reference position N on the coordinates of the driving system is obtained (step 2). As shown in FIG. 8, the first straight line L1 passes through the reference position N of the detection target 3 and is in parallel to the X-axis. The first straight line L1 is expressed by the following Eq. (1).

$$y = y1 + a \quad \text{Eq. (1)}$$

Figure 10:
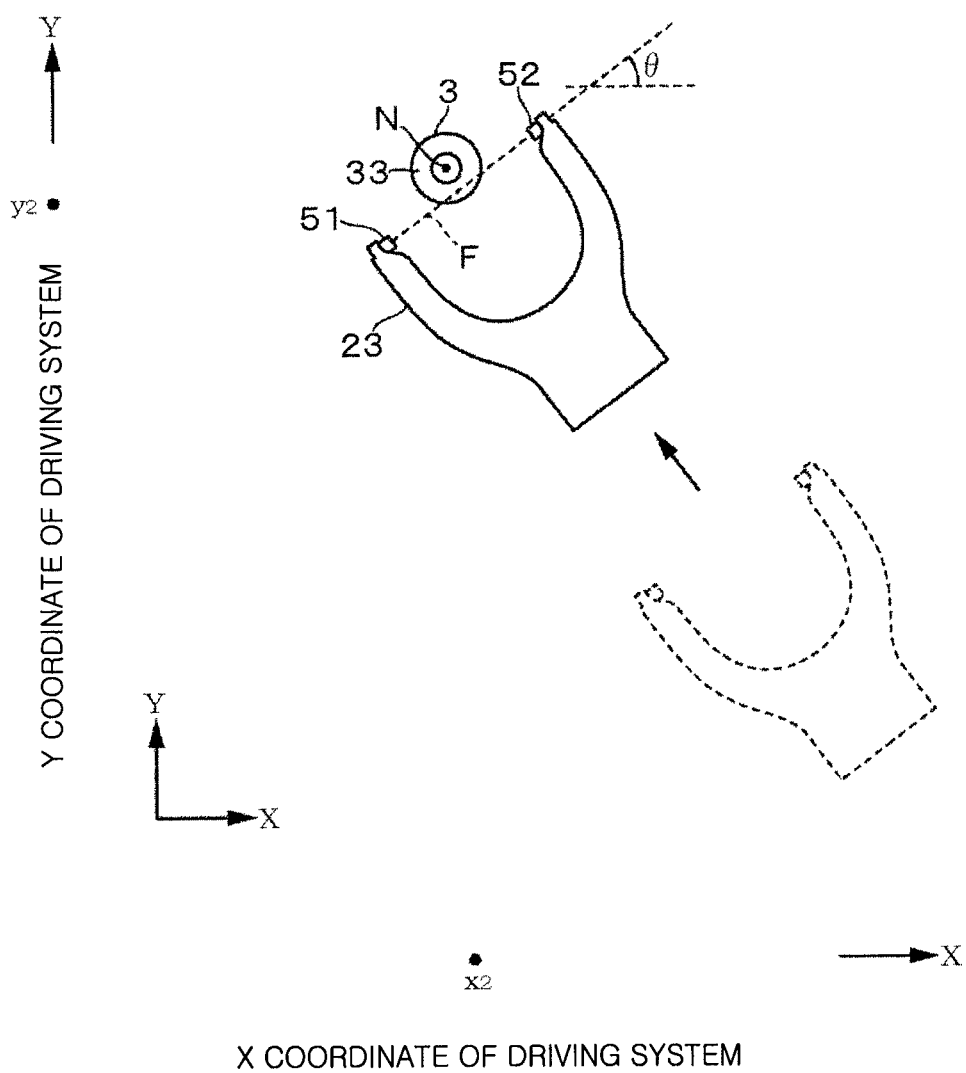
FIG. 10 shows a top view for explaining acquisition of coordinates of the detection target.
Figure 11:
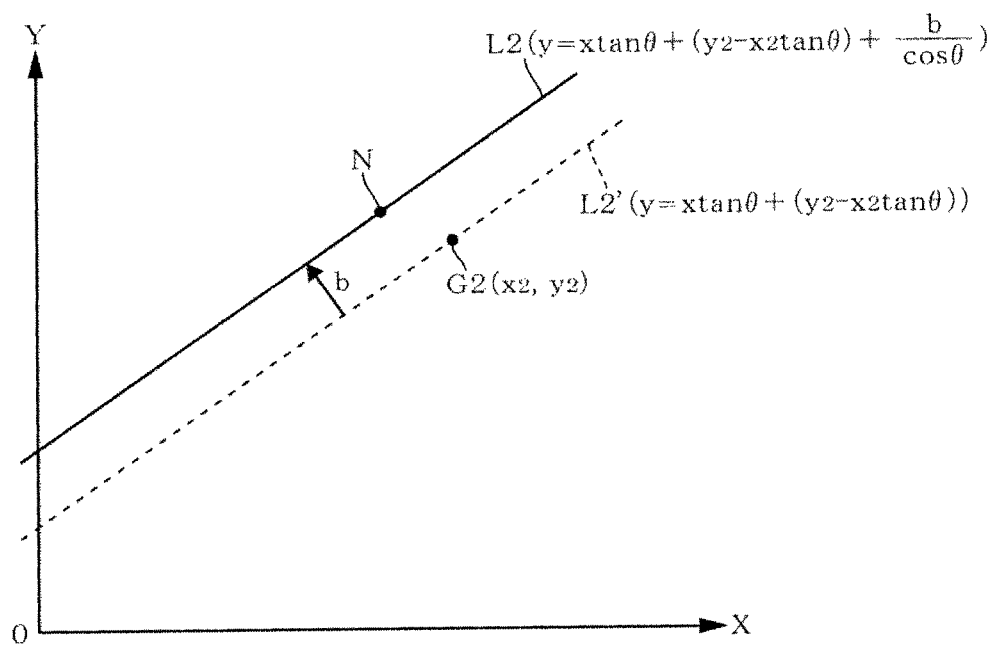
FIG. 11 is a graph showing a second straight line.

Next, as shown in FIG. 10, the optical axis F of the optical sensor 5 is located at a second position above the inclined portion 33 of the detection target 3 by setting and moving the fork 23 in the second orientation (step 3). The second orientation is an orientation obtained by inclining the optical axis F with respect to the X-axis at an angle of θ in the horizontal plane, as shown in FIG. 10, for example. FIG. 11 illustrates a position G2 (x2, y2) of the first transfer arm 2 on the XY coordinates in the driving system. The optical axis F of the optical sensor 5 extends in a direction perpendicular to the back-and-forth direction of the fork 23. A straight line L2' passing through the position G2 and extending along the optical axis F is expressed by the following Eq. (2).

$$y = x \tan \theta + (y2 - x2 \tan \theta) \quad \text{Eq. (2)}$$

Figure 12:
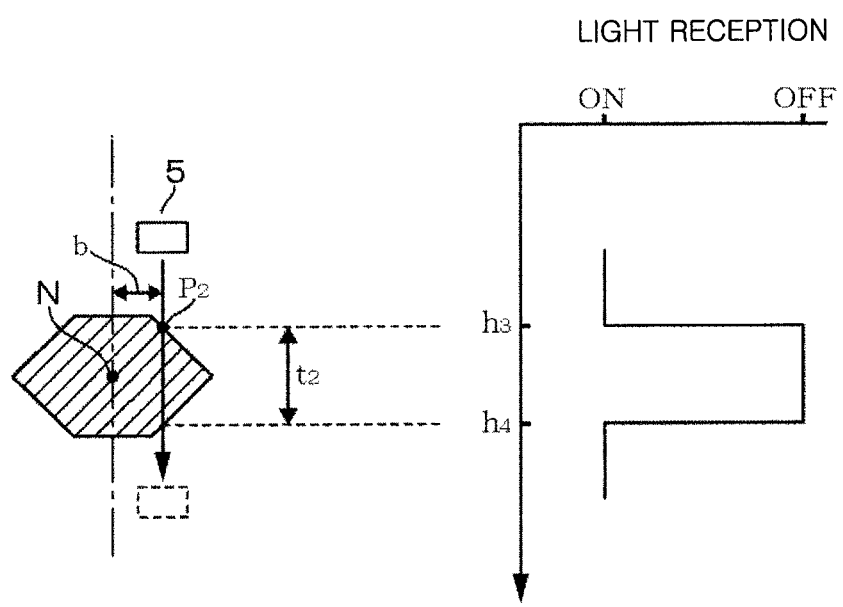
FIG. 12 shows a side view of the detection target and the optical sensor and a characteristic view of light reception/non-reception data of the optical sensor.

Next, the data of the optical sensor 5 is obtained while lowering the fork 23 from a position above the detection target 3 to a position below the detection target 3. FIG. 12 is a graph showing a corresponding relationship between a vertical dimension and light reception/non-reception data of the optical sensor 5. A light reception state is denoted by ON and a light non-reception state is denoted by OFF. The light non-reception data is obtained at a portion where the optical axis F of the optical sensor 5 is blocked by the detection target 3. Thus, the vertical dimension t2 of the inclined portion 33 is calculated by (h3−h4).

The vertical dimension t2 of the inclined portion 33 is a height of a thickest portion P2 of the inclined portion 33 where the optical axis F crosses. Based on the vertical dimension t2, the horizontal distance b from the position P2 to the reference position N is obtained.

Based on the data, the equation of a second straight line L2 passing through the reference position N on the coordinates of the driving system is obtained (step 4). As shown in FIG. 11, the second straight line L2 passes through the reference position N of the detection target 3 and is in parallel to the straight line L2'. The second straight line L2 is expressed by the following Eq. (3).

$$y = x \tan \theta + (y2 - x2 \tan \theta) + b/\cos \theta \quad \text{Eq. (3)}$$

Figure 13:
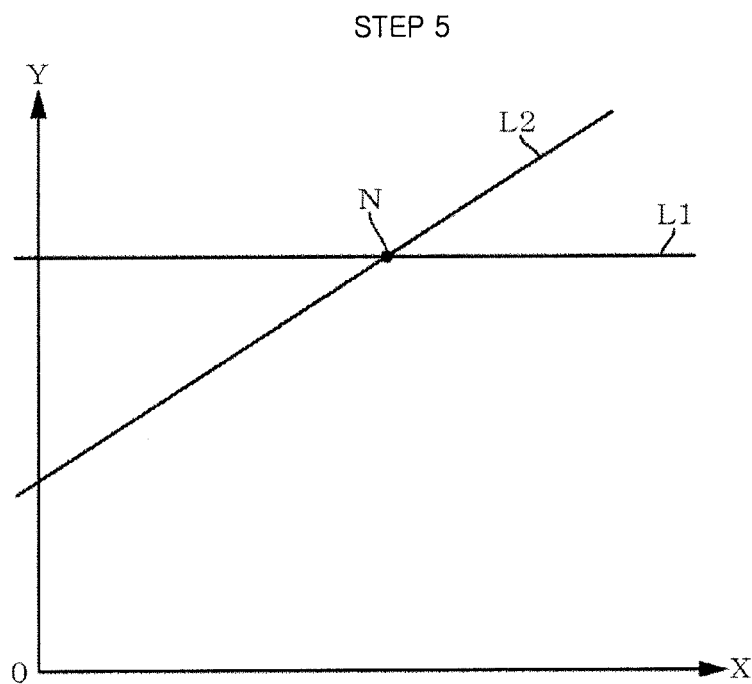
FIG. 13 is a graph showing the first straight line and the second straight line.

Next, as shown in FIG. 13, horizontal coordinates (Xa, Ya) of the reference position N of the detection target 3 which corresponds to the intersection point of the first straight line L1 and the second straight line L2 are obtained by solving the simultaneous equations of the Eq. (1) of the first straight line L1 and the Eq. (2) of the second straight line L2 (step 5).

Next, a height of the reference position N is obtained (step 6). In this example, the reference position N is set as the center of rotation of the detection target 3, so that a height Za of the reference position N is acquired by obtaining a vertical dimension of a position of the inclined portion 33, e.g., the vertical dimension t1 (h1−h2) at the position P1, and calculating {h1−(h1−h2)/2}. The acquired height of the reference position N is stored, as the data of the acquired coordinates (Xa, Ya, Za), in the control unit 6.

The acquired coordinates (Xa, Ya, Za) are compared with design coordinates (X0, Y0, Z0) of the reference position N of the detection target 3. A difference therebetween is calculated and stored as a deviation value. Since the coordinates of the reference position N are acquired by using the coordinate system managed by the driving system of the first transfer arm 2, the position relation between the reference position N and the first transfer arm 2 can be obtained. Accordingly, the position of the first transfer arm 2 can be detected by obtaining the deviation value between the acquired coordinates and the design coordinates of the reference position N. In the present invention, the position of the first transfer arm 2 is relatively obtained by acquiring the coordinates of the reference position N.

The teaching of the first transfer arm 2 is carried out by acquiring XYZ coordinates of transfer positions of the first transfer arm 2 based on the deviation value and then storing the acquired coordinates (step 7). The transfer positions of the first transfer arm 2 are positions where the wafer W is delivered to, e.g., the load-lock chambers 14, the transfer containers 1, and the alignment chamber 13. Since the relative positions of the transfer position s to the reference position N of the detection target 3 have been determined in advance, the transfer positions are acquired by correcting design XYZ coordinates of the preset transfer positions based on the deviation value.

Instead of correcting the transfer positions of the first transfer arm 2, the first transfer arm 2 may be adjusted such that the deviation value becomes zero, i.e., such that the acquired coordinates (Xa, Ya, Za) of the reference position N become identical to the design coordinates (X0, Y0, Z0).

In the present embodiment, the detection target 3 has the inclined surface that is inclined when seen from the extension direction of the optical axis F of the optical sensor 5 in the case where the fork 23 is set in the first orientation and the inclined surface that is inclined when seen from the extension direction of the optical axis F in the case where the fork 23 is set in the second orientation. A horizontal distance from the vertical axis to a position at the inclined surface (hereinafter, referred to as "distance from the vertical axis") has corresponding relation with a vertical dimension of the position at the inclined surface (hereinafter, referred to as "vertical dimension of the inclined surface"). Therefore, the distance from the vertical axis can be obtained by detecting the vertical dimension of the inclined surface by vertically moving the optical sensor 5 with respect to the detection target 3. The equation of the first straight line L1 passing through the reference position N of the detection target 3 and the equation of the second straight line L2 having a different gradient from that of the first straight line L1 are respectively obtained by setting the fork 23 in the first orientation and in the second orientation and measuring the vertical dimension of the inclined surface in each orientation. The intersection point of the first straight line L1 and the second straight line L2 serves as the reference position N, so that the horizontal coordinates (XY coordinates) of the detection target 3 can be acquired by obtaining the intersection point.

The coordinates of the reference position N are acquired by using the coordinate system managed by the driving system of the first transfer arm 2. Therefore, the relative position of the first transfer arm 2 to the reference position N can be obtained by comparing the acquired coordinates and the design coordinates of the reference position N. Accordingly, the horizontal position of the first transfer arm 2 can be automatically acquired by a simple technique that measures the vertical dimension of the detection target 3 by using the optical sensor 5 provided at the first transfer arm 2.

When the detection target 3 is a solid of revolution, a shape of a vertical cross section taken along the vertical axis is constant along the circumferential direction of the vertical axis. Thus, the corresponding relationship between a distance from the vertical axis and a vertical dimension of the inclined portion 33 which is measured by the optical sensor 5 is the same whether the fork 23 is set in the first orientation or in the second orientation. Hence, the corresponding relationship between a vertical dimension of the inclined portion 33 and a distance from the vertical axis can be commonly used even when the fork 23 is set in the different orientations. Accordingly, the coordinates of the detection target 3 can be easily obtained. When the inclined surface of the detection target 3 is a solid of revolution of a triangle, a distance from the vertical axis is simply obtained based on a vertical dimension of the inclined portion 33.

When the inclined surface of the detection target 3 is a solid of revolution of an isosceles triangle and the reference position is set to the center of rotation of the solid of revolution, a Z coordinate of the reference position can be acquired by setting the fork 23 in the first orientation or in the second orientation and measuring a vertical dimension of the inclined surface. Since the Z coordinate is acquired during the acquisition of the XY coordinates, a step of acquiring the Z coordinate is omitted and the number of steps can be reduced.

As described above, the present invention can automatically acquire the horizontal position of the first transfer arm 2, so that the acquisition (teaching) of coordinates of the transfer position of the first transfer arm 2 based on the coordinates of the detection target 3 can be automatically carried out. Accordingly, the step in which an operator manually moves the first transfer arm 2 to each transfer position is omitted, which makes it possible to reduce the operator's burden and shorten the teaching time.

Figure 14A:
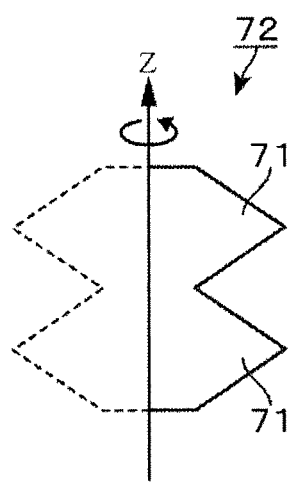
FIGS. 14A and 14B show a perspective view and an explanatory view of another example of the detection target, respectively.
Figure 14B:
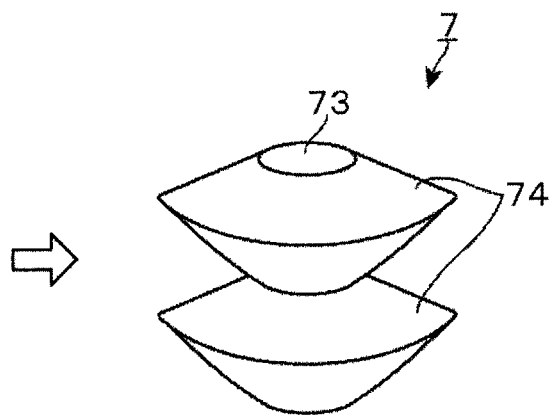

Next, another example of the detection target will be described with reference to FIGS. 14A to 19B. A detection target 7 shown in FIGS. 14A and 15 is formed by staking the detection target 3 shown in FIG. 5 in multiple levels, e.g., in two levels. The detection target 7 is a solid of revolution obtained by rotating about the vertical axis a plane FIG. 72 formed by vertically arranging two isosceles triangular areas 71 as shown in FIGS. 14A and 14B. The detection target 7 has a flat circular central portion 73 and an inclined portion 74 disposed at an outer periphery of the central portion 73. As shown in FIG. 15, the inclined portion 74 has a shape that two mountain-shaped portions are arranged vertically seen transversally. A graph showing a corresponding relationship between a height position and light reception/non-reception data shown in FIG. 15 is obtained when the optical sensor 5 is lowered from a position above the inclined portion 74 such that the optical axis F is projected on the inclined portion 74. The light reception/non-reception data has two identical waveforms and this is different from that obtained in the case of detecting an object other than the detection target 3, e.g., a tool such as a driver or the like. Accordingly, an operator can determine whether or not an object other than the detection target 3 is detected based on the graph of the display unit 64. As a result, the misdetection can be avoided. Further, a plurality of detection targets may be arranged in vertical levels while being spaced from each other.

The detection target may have a shape having no flat central portion. For example, the detection target may be a conical detection target 81 formed by rotating a triangular plane FIG. 811 about the vertical axis as shown in FIGS. 16A and 16B or may be an upside-down conical detection target 82 formed by rotating about the vertical axis a triangular plane FIG. 821 with its vertex downward. Further, the detection target may be a substantially spherical detection target 83 formed by rotating about the vertical axis a substantially semicircular plane FIG. 831 as shown in FIGS. 18A and 18B. The inclined surface of the detection target may be configured such that a height position on the included surface is changed in a curved form with respect to a horizontal distance from the vertical axis as long as the corresponding relationship between a vertical dimension and a horizontal distance from the vertical axis is satisfied.

Figure 19A:
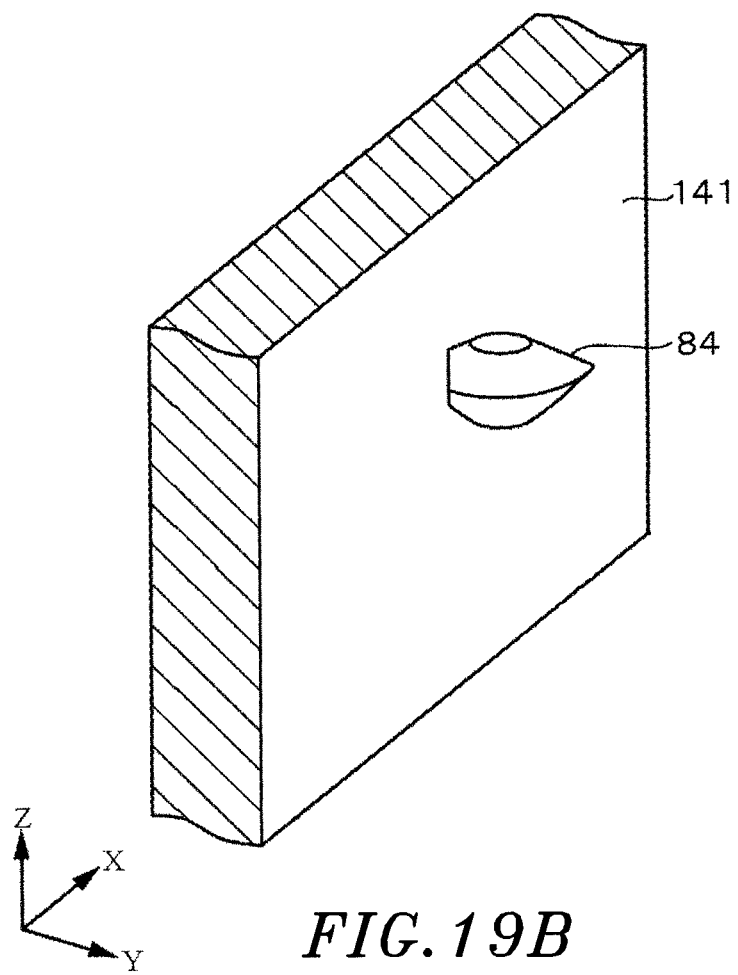
FIGS. 19A and 19B show a perspective view and a side view of further still another example of the detection target, respectively.
Figure 19B:
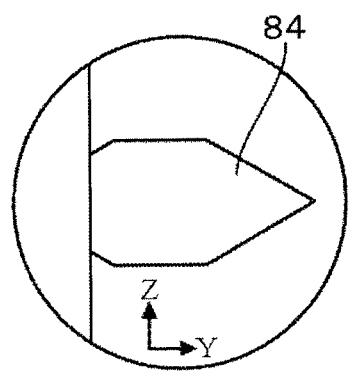

The detection target may not form the entire solid of revolution if the optical axis F of the optical sensor 5 is blocked by the inclined surface of the detection target when the optical sensor 5 is vertically moved while setting the fork 23 in the first orientation and in the second orientation. As shown in FIGS. 19A and 19B, the detection target 84 may form a part of a solid of revolution.

Figure 20A:
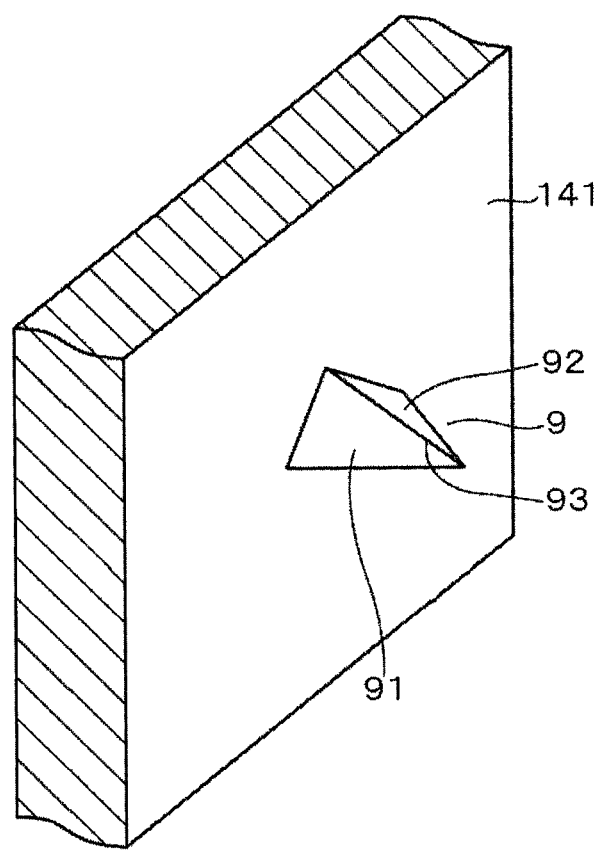
FIGS. 20A and 20B shows a perspective view and a side view of a detection target in accordance with a second embodiment of the present invention, respectively.
Figure 20B:
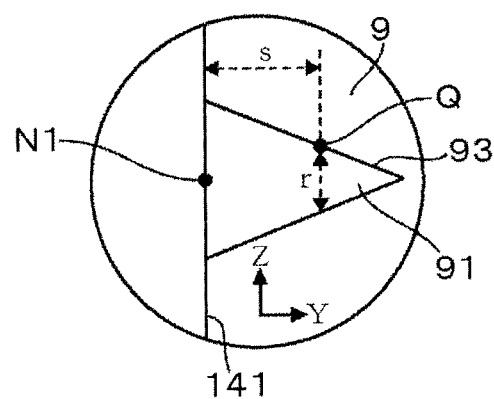
Figure 21:
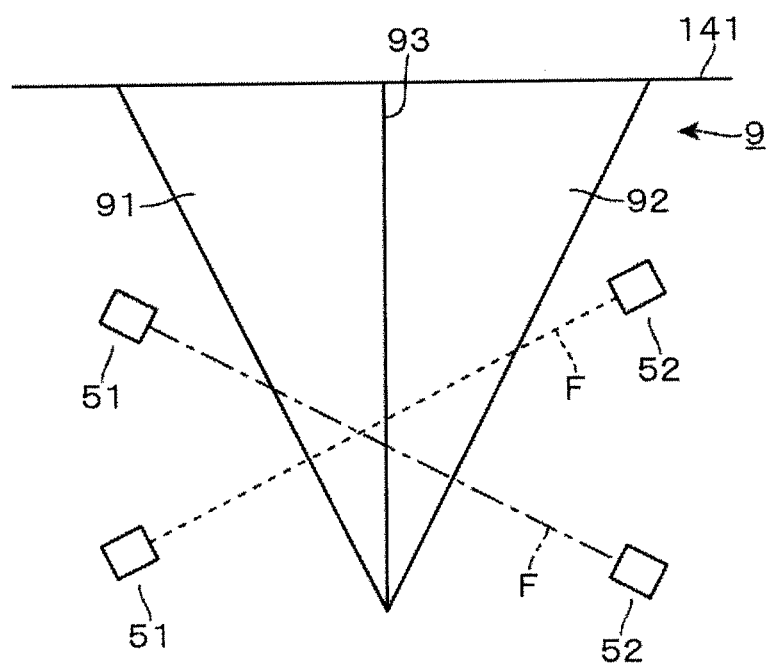
FIG. 21 shows a top view of the detection target and an optical sensor.

Next, a second embodiment of the present invention will be described with reference to FIGS. 20 and 21. The second embodiment is different from the first embodiment in that a detection target 9 is used instead of the solid of revolution. FIGS. 20A and 20B show a schematic perspective view and a side view of the detection target 9, respectively. FIG. 21 shows a top view of the detection target 9.

The detection target 9 is formed in, e.g., a trigonal pyramid shape. As shown in FIG. 21, the detection target 9 includes: an inclined surface 91 that is inclined when seen from the extension direction of the optical axis F of the optical sensor 5 in the case where the fork 23 is set in the first orientation; and an inclined surface 92 that is inclined when seen from the extension direction of the optical axis F of the optical sensor 5 in the case where the fork 23 is set in the second orientation. In FIG. 21, the optical axis F in the case where the fork 23 is set in the first orientation is indicated by a dashed dotted line and the optical axis F in the case where the fork 23 is set in the second orientation is indicated by a dotted line.

A vertical dimension of a position on a ridge 93 of the detection target 9 can be measured by setting the fork 23 in the first orientation and vertically moving the optical sensor 5 with respect to the detection target 9. In the same manner, a vertical dimension at a position on the ridge 93 of the detection target 9 can be measured by setting the fork 23 in the second orientation and vertically moving the optical sensor 5 with respect to the detection target 9. For example, if the center of a bottom surface of the detection target 9 is set as a reference position N1, a vertical dimension "r" at a position Q on the ridge 93 has a corresponding relationship with a horizontal distance "s" from the position Q to the reference position N1, as shown in FIG. 20. Therefore, a horizontal distance "s" from the position Q of the vertical dimension "r" to the reference position N1 can be obtained by measuring the vertical dimension "r" of the detection target 9. If the first orientation and the second orientation of the fork 23 are set in advance as inclinations with respect to the X-axis, for example, coordinates of the reference position N1 of the detection target 9 can be obtained by the technique of the first embodiment. As a result, the position of the first transfer arm 2 can be automatically acquired.

Figure 22:
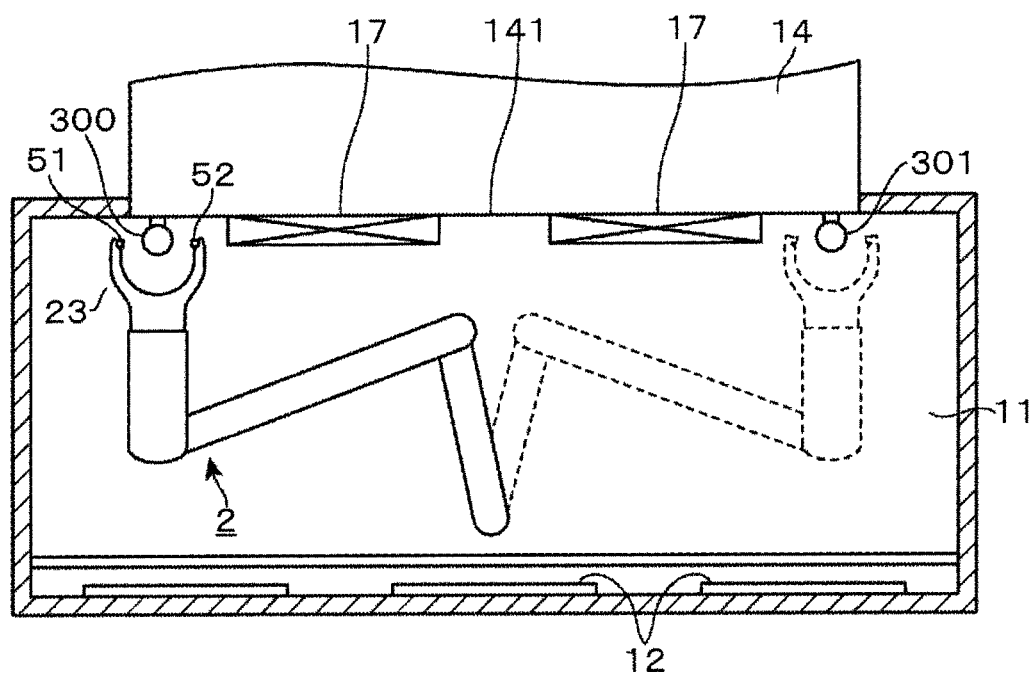
FIG. 22 shows a top view of a detection target and a first transfer arm in accordance with a third embodiment of the present invention.

Next, a third embodiment will be described with reference to FIG. 22. In the present embodiment, an inclination of the front wall 141 of the load-lock chamber 14 is obtained by detecting coordinates of a plurality of, e.g., two, detection targets 300 and 301 by using the optical sensor 5 of the first transfer arm 2, the detection targets 300 and 301 being provided near left and right ends of the front wall 141 of the load-lock chamber 14. For example, the detection target 300 is provided near the left end of the front wall 141 when seen from the transfer container 1 side. The detection target 301 is provided, at the same height as that of the detection target 300, near the right end of the front wall 141 when seen from the transfer container 1 side.

The coordinates of the reference positions N of the detection targets 300 and 301 are acquired by using the technique of the first embodiment. For example, deviation values between design Y coordinates and the acquired Y coordinates of the detection targets 300 and 301 are calculated. If one of the deviation values is larger than the other, it may be determined that the front wall 141 is inclined in the Y direction. If a deviation value between the acquired coordinates of the reference positions N of the detection targets 300 and 301 is large (e.g., greater than a preset threshold value), it may be determined that the front wall 141 is inclined in the Y direction.

Further, the inclination in the Y direction of the front wall 141 of the load-lock chamber 14 can be obtained by providing a plurality of detection targets near an upper end and a lower end of the front wall 141 of the load-lock chamber 14 and detecting coordinates of the detection targets.

Next, a fourth embodiment of the present invention will be described. The fourth embodiment relates to a technique for detecting deformation of a portion where a detection target is installed due to thermal expansion or the like by detecting coordinates of the detection target at regular intervals by the optical sensor 5 of the first transfer arm 2.

Figure 23:
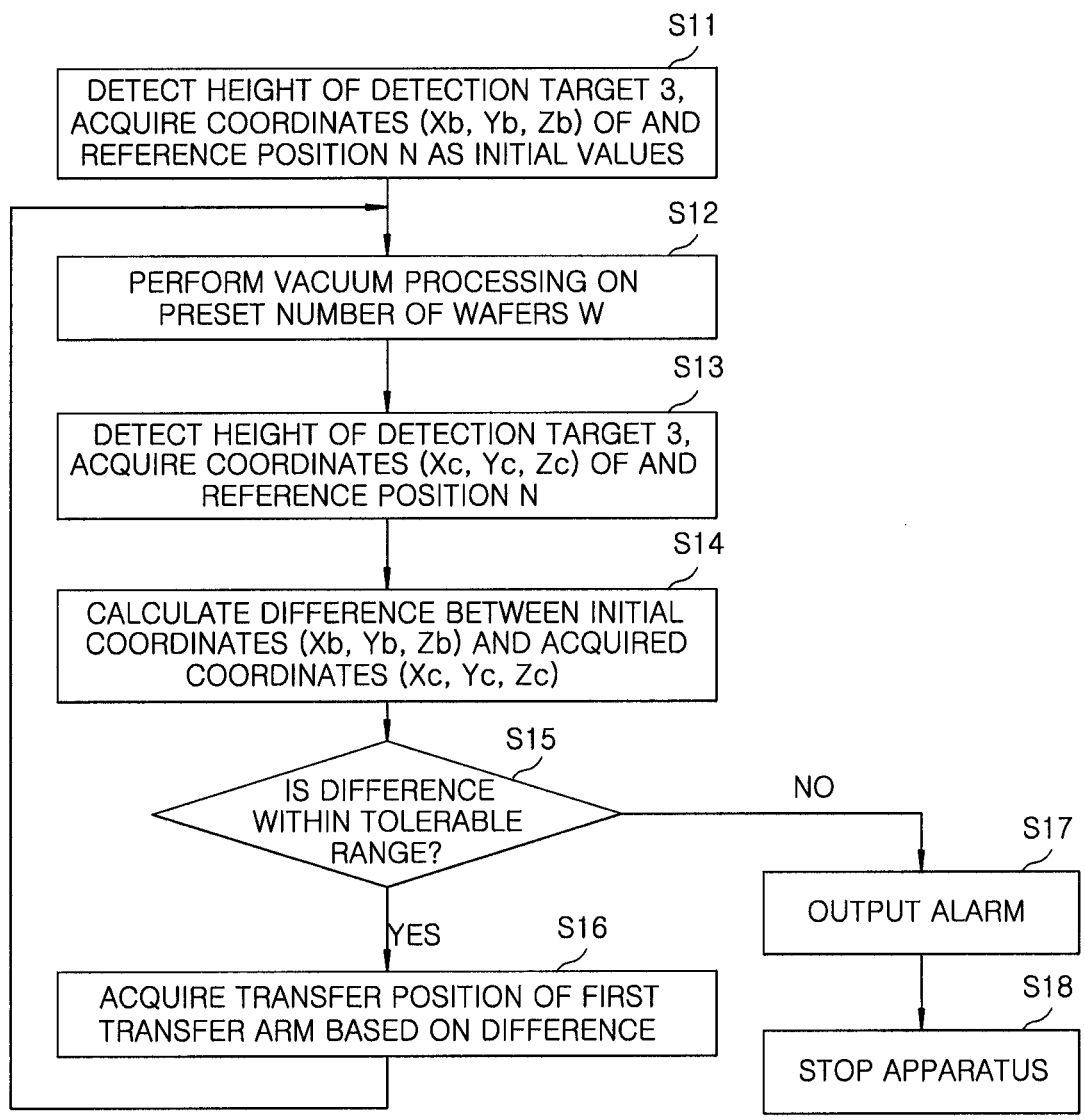
FIG. 23 shows a flowchart for explaining a fourth embodiment of the present invention.

The fourth embodiment will be described in detail with reference to the flowchart shown in FIG. 23. First, when the apparatus is assembled by a user, for example, coordinates (Xb, Yb, Zb) of the reference position N of the detection target 3 are acquired as initial values by the technique described in the first embodiment and stored in the control unit 6 (step S11). Next, a preset number of wafers W are sequentially transferred to the vacuum processing module 43 and subjected to predetermined vacuum processing (step S12). Then, coordinates (Xc, Yc, Zc) of the reference position N of the detection target 3 are acquired by the technique of the first embodiment (step S13). Then, a difference (Xb−Xc, Yb−Yc, Zb−Zc) between the initial coordinates (Xb, Yb, Zb) and the acquired coordinates (Xc, Yc, Zc) is calculated (step S14).

Thereafter, it is determined in a step S15 whether or not the difference is within a tolerable range. If the difference is within the tolerable range, the transfer position of the first transfer arm 2 is corrected based on the difference and, also, the coordinates (Xb, Yb, Zb) of the reference position N are stored as the initial values in the control unit 6. Next, the process returns to the step S12 and the vacuum processing of the wafer W is performed. On the other hand, if the difference exceeds the tolerable range, the process proceeds to a step S17 so that predetermined alarm can be output from the alarm output unit 65. Then, the apparatus is stopped (step S18). Such a series of processes is performed by the program stored in the control unit 6.

In this example, when the difference is small (within the tolerable range), the transfer position of the first transfer arm 2 is corrected. When the difference is large (greater than the tolerable range), it is determined that the load-lock chamber 14 has been deformed considerably. Accordingly, the apparatus is stopped and a predetermined control operation is performed.

In the present embodiment, even when the load-lock chamber 14 is thermally expanded and deformed by heat from the vacuum processing module 43, the deformation of the load-lock chamber 14 can be quickly detected by detecting the coordinates of the detection target 3 at regular intervals. Therefore, the apparatus can be stopped before the load-lock chamber 14 is deformed considerably. Hence, it is possible to prevent transfer error of the wafer W which is caused by the deformation of the load-lock chamber 14. The timing of acquiring the coordinates of the detection target 3 may be managed based on time instead of the processed number of the wafers W.

Figure 24:
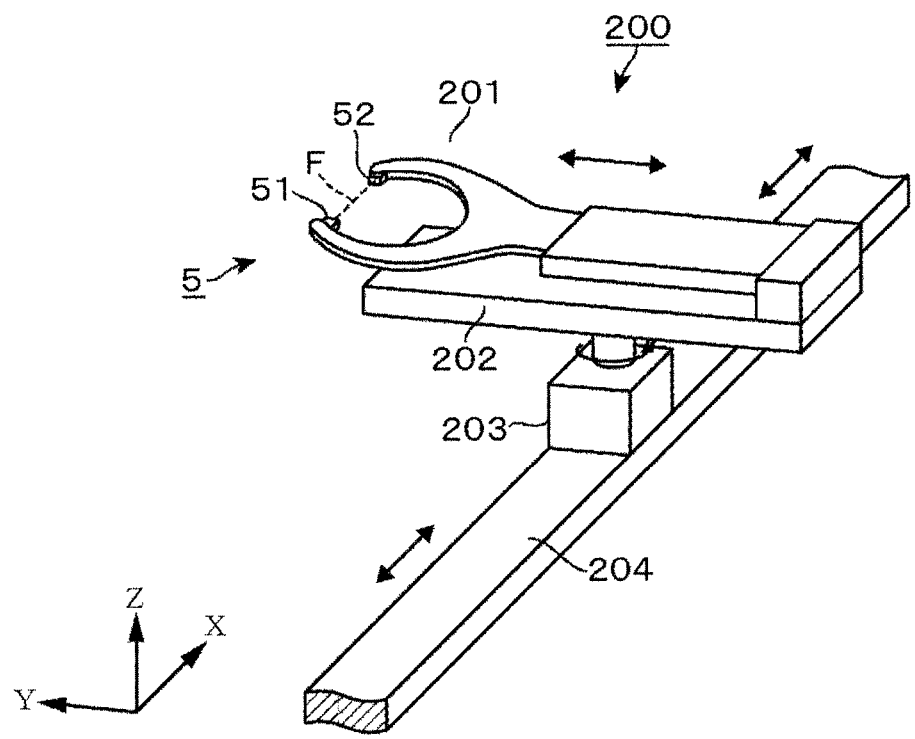
FIG. 24 shows a perspective view of another example of the substrate transfer device.
Figure 25:
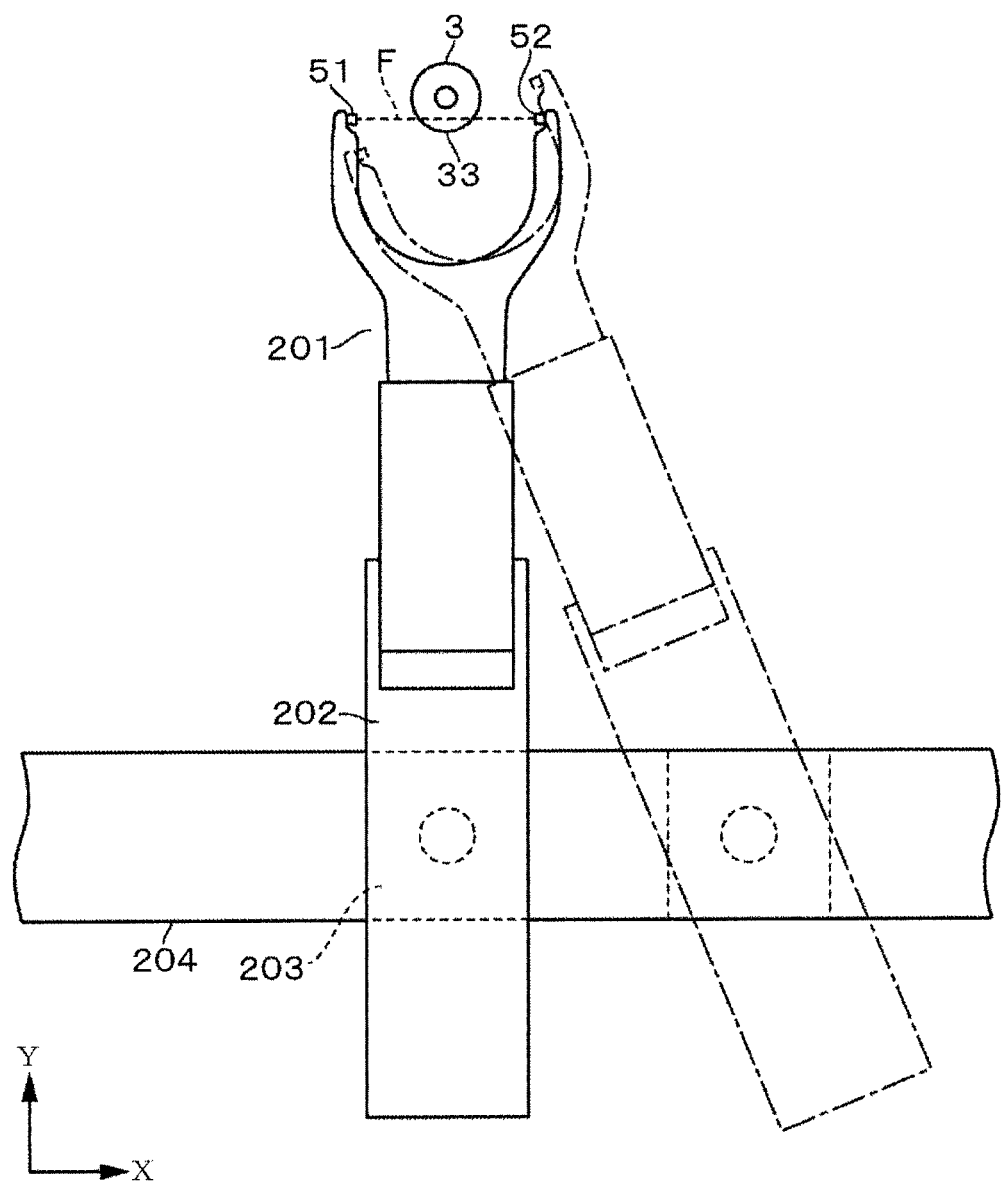
FIG. 25 shows a top view of still another example of the substrate transfer device.

The substrate transfer device of the present invention may be a transfer arm 200 having a structure shown in FIGS. 24 and 25. The transfer arm 200 is configured such that a substrate supporting unit 201 for supporting a wafer W is movable back and forth along a base 202 and the base 202 is vertically movable and rotatable about the vertical axis by a driving unit 203 including an elevation mechanism and a rotation mechanism. The driving unit 203 is movable along a guide rail 204 extending along the arrangement direction (X direction) of the load ports 10. Therefore, the substrate supporting unit 201 is movable in a back-and-forth direction, movable in a direction intersecting with the back-and-forth direction, rotatable about the vertical axis, and movable up and down.

The light receiving portion 51 and the light emitting portion 52 of the light-transmitting optical sensor 5 are provided at an inner surface of the substrate supporting unit 201 so as to face each other in a direction intersecting with the back-and-forth direction of the substrate supporting unit 201. The optical sensor 5 moves together with the substrate supporting unit 201, so that the horizontal position and the direction of the optical axis F are determined by the horizontal position and the direction of the substrate supporting unit 201.

The coordinates of the reference position N of the detection target 3 are acquired by the above-described technique while setting the substrate supporting unit 201 in a first orientation (indicated by a solid line in FIG. 25) and in a second orientation (indicated by a dotted line in FIG. 25).

Figure 26:
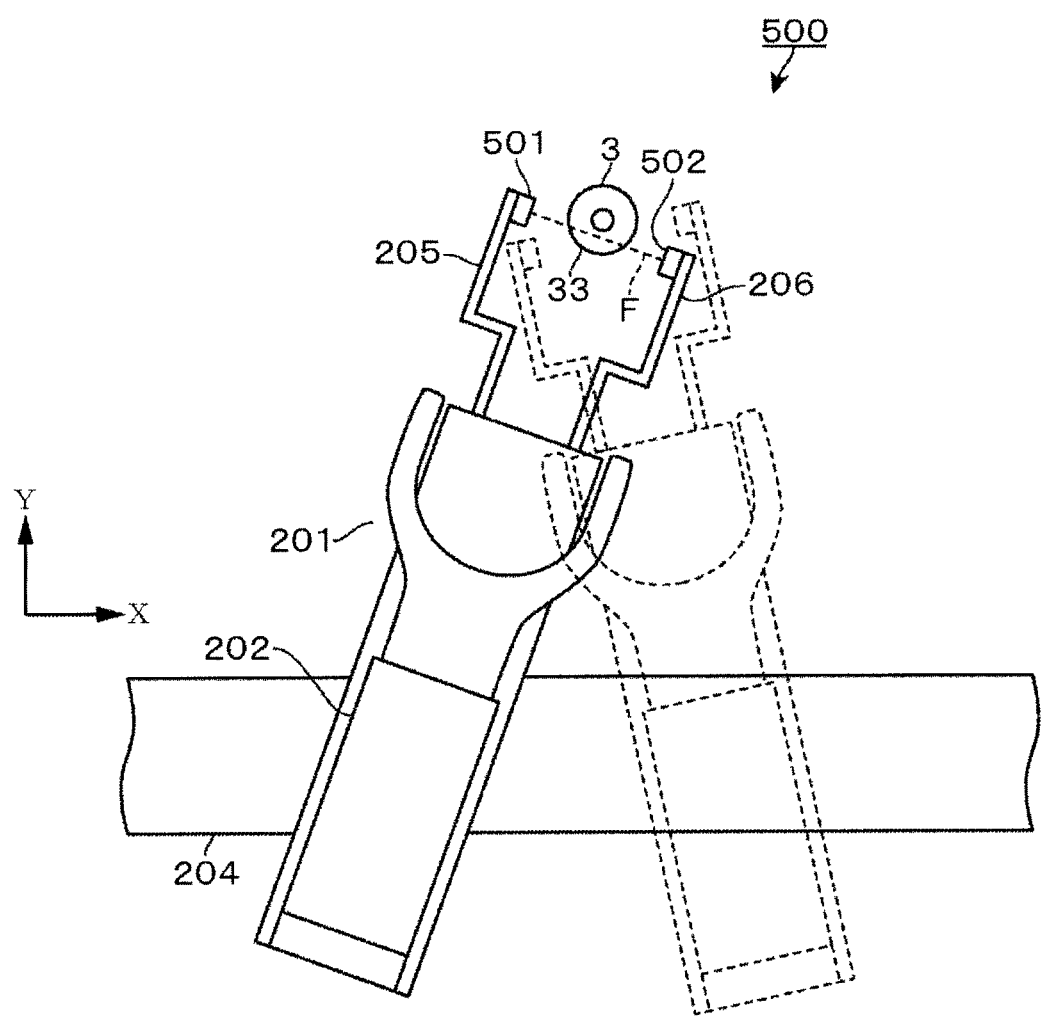
FIG. 26 shows a top view of further still another example of the substrate transfer device.

A light-transmitting optical sensor 500 is not necessarily attached to the substrate supporting unit and may be attached to the base 202 as shown in FIG. 26. In this example, a light receiving portion 501 and a light emitting portion 502 of the optical sensor 500 are provided at a leading end of the base 202 via supporting arms 205 and 206, respectively, so as to face each other in a direction intersecting with the back-and-forth direction of the substrate supporting unit 201. The substrate supporting unit 201 and the optical sensor 500 are configured to be movable in a direction intersecting with the back-and-forth direction together with the base 202, rotatable about the vertical axis and movable up and down. Accordingly, the horizontal position and the orientation of the substrate supporting unit 201 have corresponding relation with the horizontal position and the direction of the optical axis F. Hence, the horizontal position and the direction of the optical axis F are determined by the horizontal position and the orientation of the substrate supporting unit 201.

The coordinates of the reference position N of the detection target 3 are acquired by the above-described technique while setting the substrate supporting unit 201 in a first orientation (indicated by a solid line in FIG. 26) and in a second orientation (indicated by a dotted line in FIG. 26) in a state where the substrate supporting unit 201 is located at a retreat position (shown in FIG. 26). The optical sensor 500 may be provided at the base 202 so as to be movable in a back-and-forth direction along the back-and-forth direction of the substrate supporting unit 201.

The light receiving portion and the light emitting portion of the light-transmitting optical sensor do not necessarily face with other in a direction perpendicular to the back-and-forth direction of the substrate supporting unit and may face each other in a direction crossing with the back-and-forth direction. Further, the coordinates of the reference position of the detection target may be acquired by vertically moving the detection target while fixing the vertical position of the optical sensor. The detection target may be provided at the load port 10 side of the normal pressure transfer chamber 11. Moreover, coordinates of a detection target provided in the vacuum transfer chamber 41 may be acquired by the light-transmitting optical sensor provided at the second transfer arm 45 of the vacuum transfer chamber 41, thereby acquiring the position of the second transfer arm 45. In addition, only horizontal coordinates (X, Y) of the detection target may be obtained by measuring the vertical dimension of the detection target by the optical sensor provided at the substrate transfer device and a vertical coordinate Z of the detection target may be detected by another technique. The vertical coordinate of the detection target may be obtained from data which is acquired when the optical sensor 5 is vertically moved at a position where the optical axis F of the optical sensor 5 corresponding to the central portion 32 of the detection target 3.

While the invention has been shown and described with respect to the embodiments, it will be understood by those skilled in the art that various changes and modifications may be made without departing from the scope of the invention as defined in the following claims.

What is claimed is:

1. A method for detecting a position of a substrate transfer device including a substrate supporting unit for supporting a substrate, the substrate supporting unit being movable in a back-and-forth direction, movable in a direction intersecting with the back-and-forth direction and rotatable about a vertical axis, the method comprising:
providing a light-transmitting optical sensor at the substrate transfer device such that a light emitting portion and a light receiving portion of the optical sensor face each other in a direction intersecting with the back-and-forth direction, the light-transmitting optical sensor having an optical axis of which horizontal position and orientation are determined by a horizontal position and an orientation of the substrate supporting unit;
providing a detection target at a predetermined relative position with respect to a position where a substrate is to be transferred by the substrate transfer device so as to block the optical axis of the optical sensor, the detection target having an inclined surface that is inclined when seen from an extension direction of the optical axis when the substrate supporting unit is set in a first orientation and an inclined surface that is inclined when seen from an extension direction of the optical axis when the substrate supporting unit is set in a second orientation;
measuring a vertical dimension of the detection target that blocks the optical axis by setting the substrate supporting unit in the first orientation and relatively moving up or down the optical sensor with respect to the detection target;
measuring a vertical dimension of the detection target that blocks the optical axis by setting the substrate supporting unit in the second orientation and relatively moving up or down the optical sensor with respect to the detection target; and
obtaining horizontal coordinates of a reference position of the detection target based on measured vertical dimensions in the first orientation and the second orientation.

2. The method of claim 1, wherein an outer shape of the detection target corresponds to an outer shape of a solid of revolution obtained by rotating a vertical plane about the vertical axis.

3. The method of claim 1, wherein the detection target is stacked in multiple levels.

4. The method of claim 2, wherein the reference position is a center of rotation of the solid of revolution.

5. The method of claim 1, further comprising: obtaining a height of the reference position of the detection target based on the vertical dimension measured when the substrate supporting unit is set in the first orientation or in the second orientation.

6. A non-transitory storage medium that stores a computer program used in an apparatus for detecting a position of a substrate transfer device including a substrate supporting unit for supporting a substrate, the substrate supporting unit being movable in a back-and-forth direction, movable in a direction perpendicular to the back-and-forth direction and rotatable about a vertical axis,
wherein the computer program implements a method of:
providing a light-transmitting optical sensor at the substrate transfer device such that a light emitting portion and a light receiving portion of the optical sensor face each other in a direction intersecting with the back-and-forth direction, the light-transmitting optical sensor having an optical axis of which horizontal position and orientation are determined by a horizontal position and an orientation of the substrate supporting unit;
providing a detection target at a predetermined relative position with respect to a position where a substrate is to be transferred by the substrate transfer device so as to block the optical axis of the optical sensor, the detection target having an inclined surface that is inclined when seen from an extension direction of the optical axis when the substrate supporting unit is set in a first orientation and an inclined surface that is inclined when seen from an extension direction of the optical axis when the substrate supporting unit is set in a second orientation;
measuring a vertical dimension of the detection target that blocks the optical axis by setting the substrate supporting unit in the first orientation and relatively moving up or down the optical sensor with respect to the detection target;
measuring a vertical dimension of the detection target that blocks the optical axis by setting the substrate supporting unit in the second orientation and relatively moving up or down the optical sensor with respect to the detection target; and
obtaining horizontal coordinates of a reference position of the detection target based on measured vertical dimensions in the first orientation and the second orientation.

7. An apparatus for detecting a position of a substrate transfer device including a substrate supporting unit for supporting a substrate, the substrate supporting unit being movable in a back-and-forth direction, movable in a direction intersecting with the back-and-forth direction, and rotatable about a vertical axis, the apparatus comprising:
- a light-transmitting optical sensor provided at the substrate transfer device such that a light emitting portion and a light receiving portion of the optical sensor face each other in a direction intersecting with the back-and-forth direction, the light-transmitting optical sensor having an optical axis of which horizontal position and orientation are determined by a horizontal position and an orientation of the substrate supporting unit;
- a detection target provided at a predetermined relative position with respect to a position where a substrate is to be transferred by the substrate transfer device so as to block the optical axis of the optical sensor, the detection target having an inclined surface that is inclined when seen from an extension direction of the optical axis when the substrate supporting unit is set in a first orientation and an inclined surface that is inclined when seen from an extension direction of the optical axis when the substrate supporting unit is set in a second orientation;
- an elevation unit configured to relatively move up and down the optical sensor with respect to the detection target; and
- a control unit configured to measure a vertical dimension of the detection target that blocks the optical axis by relatively moving up or down the optical sensor with respect to the detection detector while setting the substrate supporting unit in the first orientation and in the second orientation and acquiring horizontal coordinates of a reference position of the detection target based on measured vertical dimension in the first orientation and the second orientation.

8. The apparatus of claim 7, wherein an outer shape of the detection target corresponds to an outer shape of a solid of revolution obtained by rotating a vertical plane about the vertical axis.

9. The apparatus of claim 7, wherein the detection target is stacked in multiple levels.

10. The apparatus of claim 8, wherein the reference position is a center of rotation of the solid of revolution.

11. The apparatus of claim 7, wherein the optical sensor is configured to be vertically moved together with the substrate supporting unit.

12. The apparatus of claim 7, wherein the control unit is configured to obtain a height of the reference position of the detection target based on the vertical dimension measured when the substrate supporting unit is set in the first orientation or in the second orientation.

* * * * *